United States Patent
Tran et al.

(10) Patent No.: US 8,498,113 B2
(45) Date of Patent: Jul. 30, 2013

(54) DISASTER-PROOF DATA SAFE FOR HOUSING FUNCTIONAL ELECTRONIC DATA PROCESSING, STORAGE AND COMMUNICATIONS SYSTEMS

(76) Inventors: Henry Hung Tran, Pacifica, CA (US); Quynh Anh Kim Nguyen, Pacifica, CA (US); Michael Hai Tran, Houston, TX (US)

(*) Notice: Subject to any disclaimer, the term of this patent is extended or adjusted under 35 U.S.C. 154(b) by 211 days.

(21) Appl. No.: 13/233,017

(22) Filed: Sep. 14, 2011

(65) Prior Publication Data

US 2012/0325126 A1 Dec. 27, 2012

Related U.S. Application Data

(60) Provisional application No. 61/382,895, filed on Sep. 14, 2010.

(51) Int. Cl.
*H05K 7/20* (2006.01)
*E05G 1/12* (2006.01)

(52) U.S. Cl.
USPC .......... 361/688; 361/679.01; 361/679.02; 361/679.46; 361/679.53; 361/679.57; 361/696; 361/699; 312/223.2; 312/236; 312/409; 174/50; 174/50.5

(58) Field of Classification Search
USPC .......... 361/679.01, 679.02, 679.31, 679.33, 361/679.46, 679.53, 679.57, 690, 694, 688, 361/689, 698, 699, 715, 724–728; 312/223.2, 312/223.3, 236, 265, 409; 174/50, 50.5, 520; 165/104.33, 185, 80.4, 80.5; 109/29, 65; 280/47.35; 62/3.2, 3.3, 259.2
See application file for complete search history.

(56) References Cited

U.S. PATENT DOCUMENTS

| | | | | |
|---|---|---|---|---|
| 3,559,594 | A * | 2/1971 | Miller | 109/84 |
| 4,616,694 | A * | 10/1986 | Hsieh | 165/47 |
| 4,685,402 | A * | 8/1987 | Nelson et al. | 109/65 |
| 5,479,341 | A * | 12/1995 | Pihl et al. | 700/79 |
| 5,555,156 | A * | 9/1996 | Decante | 361/679.57 |
| 6,158,833 | A * | 12/2000 | Engler | 312/409 |
| 6,736,473 | B2 * | 5/2004 | Cleveland et al. | 312/409 |
| 7,245,491 | B2 * | 7/2007 | Throckmorton et al. | 361/695 |
| 7,461,849 | B2 * | 12/2008 | Robbins et al. | 280/47.35 |
| 7,628,409 | B2 * | 12/2009 | Robbins et al. | 280/47.35 |
| 7,916,487 | B2 * | 3/2011 | Bitton et al. | 361/724 |
| 2006/0075509 | A1 * | 4/2006 | Kishon | 726/34 |
| 2009/0045203 | A1 * | 2/2009 | Ehrlich | 220/592.01 |
| 2010/0027212 | A1 * | 2/2010 | Daunert Armillas | 361/679.33 |
| 2012/0087085 | A1 * | 4/2012 | Moore et al. | 361/679.46 |

* cited by examiner

*Primary Examiner* — Michael V Datskovskiy

(57) ABSTRACT

A disaster-proof data safe with multiple, insulated, surrounding solid structural metal walls for housing functioning digital electronic computing, data processing, data storage, communications and high power density blade server systems has one or more coaxial helical coil coolant tubes circulating a coolant liquid encircled around an interior hexahedral, housing space for removing heat generated in the housing space and insulating the housing space from sources of heat external to the safe. Features of the safe include a plurality of longitudinal heat sink bars thermally coupled to the encircling helical coil coolant tubes supported either by the helical coil coolant tubes or the interior structural metal sidewalls of the housing space. The helical coil coolant tubes and the heat sink bars are preferably composed from metals such as copper, aluminum and their alloys that have a high thermal conductivity and that retain structural integrity at temperature ranging up to 500° C.

13 Claims, 22 Drawing Sheets

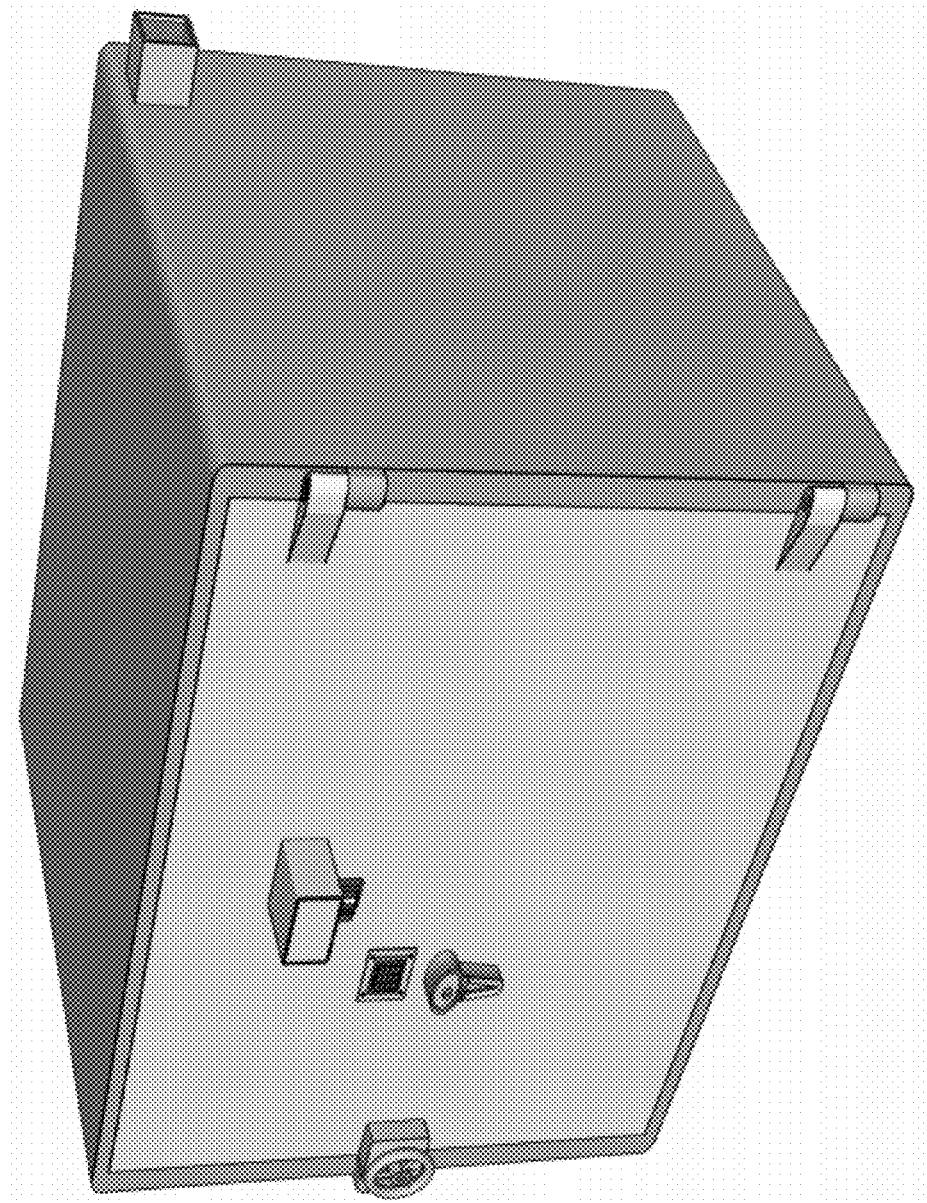

DISASTER-PROOF DATA SAFE FOR HOUSING FUNCTIONAL ELECTRONIC DATA PROCESSING, STORAGE AND COMMUNICATIONS SYSTEMS

CROSS-REFERENCE TO RELATED APPLICATIONS

This application claims the benefit of provisional patent application Ser. No. 61/382,895, filed 2010 Sep. 14 by the present inventors, which is incorporated by reference.

BACKGROUND OF THE INVENTION

1. Field of the Invention

The inventions relate to features of high integrity, survivable enclosure structures for housing, cooling, protecting and preserving electronic components of functioning high power density blade server data processing systems, including multiple computing, data storage, and communication rack-mounted modules in the event of a disaster.

2. Description of the Prior Art

Disaster-proof data safe enclosures are based on well-proven technologies found in regular fireproof and waterproof safes that have been widely used for nearly 200 years.

Essential features desired in data safe enclosures include:
  (i) Structural integrity sufficient to survive penetration before, upon, during, and after collapse of a building or extreme impacts due to fire, explosion, vandalism, flood, earthquake, hurricane, tsunami, or other disasters; (See U.S. Class 109 Subclasses 6, 7, 220 Subclasses 900.)
  (ii) Thermal isolation of the enclosed safe volume before during and after in the event of a fire disaster; (See U.S. Class 220 Subclasses 560.12, 592.01, 592.2, 592.09, & U.S. Class 361 Subclasses 600, 679.01, 704, 816, 818)
  (iii) Hermetic and electromagnetic isolation of the enclosed safe volume from the ambient exterior environment before, during and after a flood or EMI disaster; (See U.S. Class 109, subclass 1R U.S. Class 361 Subclasses 600, 679.01, 688 704, 816, 818)
  (iv) An enclosed safe volume sufficient to house multiple functioning/operable data processing systems, including multiple computing, data storage, and communications components, e.g. a high power density blade server system; (see U.S. Class 710 subclasses 72, 74 & U.S. Class 711 Subclasses 114, & U.S. Class 361, Subclasses 679.02, 724)
  (v) Conduits hermetically accessing the enclosed safe volume for means to remove heat, supplying power to, allowing control of, and permitting communications with data processing systems housed in the enclosed safe volume before a disaster; (See for example U.S. Class 137 Subclass 75; U.S. Class 340, Subclasses 5.7, 5.73)
  (vi) Efficient removal of heat from the enclosed safe volume generated by housed functioning data processing systems that otherwise would buildup and damage and/or deleteriously affect performance of the housed systems; (See U.S. Class 62 Subclass 259.1, 259.2; U.S. Class 165 Subclasses 80.4, 80.5; U.S. Class 220 subclass 592.01 & U.S. Class 361 Subclasses 676, 688, 689, 698, 699, & 700)
  (vii) A Mass requiring machine assistance for transport between locations, i.e., sufficient to preclude man portability.
  (viii) High security access control to prevent unauthorized access, theft, and vandalism.

Natural and man-made disaster is a fact of life. The recent April 2011 powerful earthquake in Japan illustrated how unrelated disasters could happen unpredictably and simultaneously. The initial earthquake not only damaged many building structures and created many local fires, but also triggered a powerful tsunami that flooded and destroyed many large coastal cities, industrial facilities, business offices, and even a nuclear power plant. These combined catastrophic events created unprecedented disasters in a swift moment: fires, building collapses, floods, tsunami, and environmental contaminations.

In the internet, social network and electronic commerce era, archived and real-time electronic data become more important and valuable to business entities and individuals. The need to continuously secure and protect these electronic data against unforeseen disasters, such as the Japan earth quake above is highly critical and extremely desirable. The traditional fire-proof/water-proof safes are currently still being used to protect printed documents and other archived storage media such as backup tapes, optical disks, and USB drives. These traditional safes cannot be used to house heat-generating electronic components for the computing systems due to the lack of mechanism to dissipate heat to the outside of their enclosures. The present invention, the disaster-proof data safe, relate to features of high integrity, survivable enclosure structures for housing, cooling, protecting and preserving electronic components of functioning high power density blade server data processing systems, including multiple computing, data storage, and communication rack-mounted modules in the event of a disaster.

SUMMARY OF THE INVENTION

A disaster-proof data safe with multiple, insulated, surrounding solid structural metal walls for housing functioning digital electronic computing, data processing, data storage, communications and high power density blade server systems has one or more coaxial helical coil coolant tubes circulating a coolant liquid encircled around an interior hexahedral, housing space for removing heat generated in the housing space and insulating the housing space from sources of heat external to the safe. Features of the safe include a plurality of longitudinal heat sink bars thermally coupled to the encircling helical coil coolant tubes supported either by the helical coil coolant tubes or the interior structural metal sidewalls of the housing space. The helical coil coolant tubes and the heat sink bars are preferably composed from metals such as copper, aluminum and their alloys that have a high thermal conductivity and that retain structural integrity at temperature ranging up to 500° C.

A multiple-jam, access-portal through either or both ends of the safe provides controlled access into the hexahedral, interior housing space within the safe. Each multiple jam access portal is closed by a conventional, lockable, safe door with multiple solid structural metal walls and strike surfaces configured for nesting snugly within each multiple jam access portal. Bead type or 'O'-ring seals are secured and located for compression between jam surfaces the multiple jam access portal frame and strike (seating) surfaces of the safe door when it is closed and locked for hermitically and electromagnetically isolating the interior hexahedral housing space. External electrical power for, communications with and control of systems housed within the safe is afforded by conventional isolating hermetically sealed conduits communicating from outside, into the interior of the hexahedral housing space of the safe. Self-contained embodiments of the disaster-proof data safe, have an internal pump coupled for circulating the coolant liquid through the encircling coaxially helical coil tubes. Integrated embodiments of the disaster-proof data safe, have an external electrical pump for circulating coolant through the encircling coaxially helical coil tubes coupled to an appropriately located conventional isolating inlet/outlet coolant ports hermetically communicating through the sidewalls of the safe. Heat generated by the functioning digital electronic computing, data processing, data storage and communications systems in the interior hexahedral housing space is efficiently transferred (removed) by the coolant liquid circulating through the helical coil tubes thermally coupled to the longitudinal heat sink bars and/or successive enclosing, solid metal walls of the safe. When the rate of heat transfer from the interior hexahedral housing space is not sufficient to maintain temperature below a set temperature for the housed electronic systems, a conventional active, external coolant system, e.g., a vapor-compression cycle (Freon) refrigeration cooling system, may be thermally coupled for either cooling a section of the internal encircling coaxially helical coil tubes, or for cooling the coolant circulating in the helical coil tubes.

BRIEF DESCRIPTION OF THE FIGURES

In FIG. 8c external side and walls of the port are cut away to reveal thermal insulation materials.

FIG. 12 is perspective rendering of another embodiment of a disaster-proof data safe with front and rear safe doors open showing a vertical array of heat sink bars mechanically secured to, and thermally with opposite sidewalls of the internal housing space of the safe adapted to receive, support and thermally couple with blade server modules and the like.

FIG. 16 is a perspective rending of a disaster-proof data safe with a single safe door.

ITEMIZATION OF PARTS

Reference Numerals

100—Disaster-proof Data Safe
101—Outside Safe Sidewall
102—Inside Safe Sidewall
103—Data Processing Blade Component
104—Cu Helical Coil Coolant Tube
105—Multiple-Jam Access Portal Frame
106—Al Heat Sink Bar
107—Multiple-Strike Surfaces Safe Doors
108—EMI Bead Seal
109—Hermetic Bead or 'O'-Ring Seal
110—Handling Bail
111—Safe Door Conduit
112—Front Safe Door
113—Door Cramming Latch
114—Safe Door Locking Bolts
115—Safe Door Cramming Strike
118—Component Rack
121—Rear Safe Door
122—Rear Power Inlet Port
123—Rear Door Communication Port
124—Front Door Communication Port
201—Low Density Concrete Insulation
202—Exterior Power Wall Port
203—Coolant Inlet Lines
204—Coolant Outlet Lines
205—Coolant Circulation Wall Port
206—External Wall Frame Support Members
207—Interior Power Conduits
208—Internal Wall Frame Support Members
209—Helical Coil Coolant Tube Inlet
210—Helical Coil Coolant Tube Outlet
301—Outside Surface, Internal Safe Sidewall
302—Inside Surface, Internal Safe Sidewall 401—Lock Actuator
402—Lock Entry Keypad
501—Insulation Layer Back Safe Door
601—Outer Insulation Layer
602—Middle Insulation Layer
603—Inner Insulation Layer
604—Door Bolt Locking & Unlocking Mechanism
701—Latch Pin
702—Gear Drive Latch Pin
801—Fluid Conduit
802—Data & Power Cables
803—Rubber Gasket
804—Disposable Insulator
901—Standard Equipment Rack
1001—Cu/Al Heat Sink Bar
1002—Cu Sliding Contacts
1101—Heat Generating Electronic Components
1102—Component Heat Sink
1103—Heat Pipe Array
1104—Thermal Coupling between Heat Pipe Array & Cu Sliding Contacts
1105—Enclosure Wall of Electronic Equipment
1201—Cu/Al Heat Sink Bars
1301—Outside Array of Rectangular Coolant Tubes
1302—Manifold for Outside Array of Rectangular Coolant Tubes
1303—Inside Array of Rectangular Coolant Tubes
1304—Manifold for Inside Array of Rectangular Coolant Tubes
1401—Inlet & Outlet to Manifolds for Outside Array of Rectangular Coolant Tubes
1402—Inlet & Outlet to Manifolds for Inside Array of Rectangular Coolant Tubes

DETAILED DESCRIPTION

Figure 1:
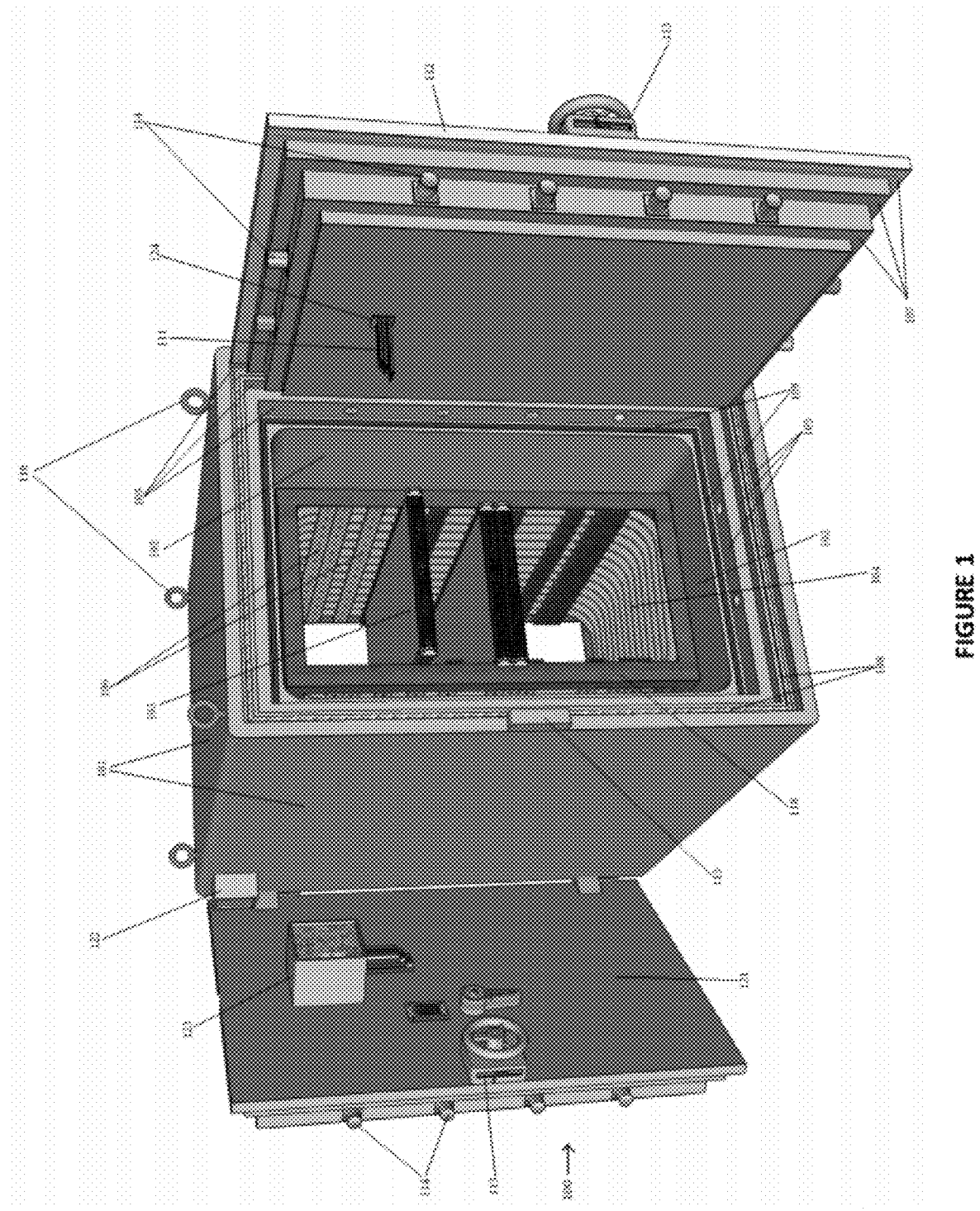
FIG. 1 is representative rendering of an embodiment of a disaster-proof data safe with front and back safe doors open.

FIG. 1 illustrates a first embodiment of a disaster-proof data safe 100 with both front safe door 112 and back safe door 121 being in the opening positions. An industry standard component rack 118 having a plurality of functioning data processing blade components 103 is placed inside the hexahedral enclosure having inside safe sidewalls 102, inside wall front safe door 112, and inside wall rear safe door 121. All interior walls are made of relatively thick steel sheet for structural supports and have air-tight welded seams and gaskets to prevent water, vapor, or superheated steam from entering the inside enclosure during fire. The component rack 118 is integrated with copper (Cu) helical coil coolant tubes 104 circulating a coolant liquid encircled around the interior hexahedral housing space to remove thermal heat from the functioning data processing blade components 103 through a plurality of heat sink bars 106. Since the surface areas of the Cu helical coil coolant tubes 104 are relatively large, any thermal heat in the hot air within the enclosure is also effectively removed through conductive surface contacts with Cu helical coil coolant tubes 104. The helical coil coolant tubes and the heat sink bars are preferably composed from metals such as copper, aluminum and their alloys that have a high thermal conductivity and that retain structural integrity at temperature ranging up to 500° C.

The exterior walls of the embodiment comprise of outside safe sidewalls 101, outside wall front safe door 112, and outside wall rear safe door 121. All exterior walls are also made of relatively thick steel sheet for structural supports. To facilitate the transport, positioning, and moving of the disaster-proof data safe 100, steel handling bails 110 are securely installed at four corners on top of the embodiment.

Door openings to provide access into the hexahedral, interior housing space within the safe are fitted with multiple jam access portal frames 105 to accommodate the snugly fittings of multiple-strike (seating) surfaces 107 of front door 112 and rear door 121. Bead type or 'O'-ring seals 109 are secured and located for compression between jam surfaces the multiple jam access portal frame 105 and strike surfaces 107 of the safe door when it is closed and locked for hermitically and electromagnetically isolating the interior hexahedral housing space.

Safe front door 112 is a conventional, lockable, safe door with multiple solid structural metal walls and strike surfaces 107 configured for nesting snugly within each multiple-jam access portal 105 of the safe front. Safe front door 112 contains a plurality of large diameter steel locking bolts 114 to increase security protections and also to prevent front door 112 disengaged from the multiple jam access portal frame due to heavy external loads as in the case of building collapse. Door cramming latch 113 and door cramming strike 115 are used to fully compress hermetic bead seal 109 and EMI bead seal 108 against their contacting surfaces to fully seal the enclosure. External electrical power for, communications with and control of systems housed within the safe is afforded through the front door communication port 124 and hermetically sealed conduits 111.

Similarly, safe rear door 121 is a conventional, lockable, safe door with multiple solid structural metal walls and strike surfaces 107 configured for nesting snugly within each multiple-jam access portal 105 of the safe rear. Safe rear door 121 contains a plurality of large diameter steel locking bolts 114 to increase security protections and also to prevent rear door 121 disengaged from the multiple jam access portal frame due to heavy external loads as in the case of building collapse. Door cramming latch 113 and door cramming strike 115 are used to fully compress hermetic bead seal 109 and EMI bead seal 108 against their contacting surfaces to fully seal the enclosure. External electrical power for, communications with and control of systems housed within the safe is afforded through the rear door communication port 123 and hermetically sealed conduits 111.

To accommodate equipment with high power electrical load, a dedicated power inlet port 122 is provided instead of using the rear and front communication ports 123 and 124, respectively.

Figure 2:
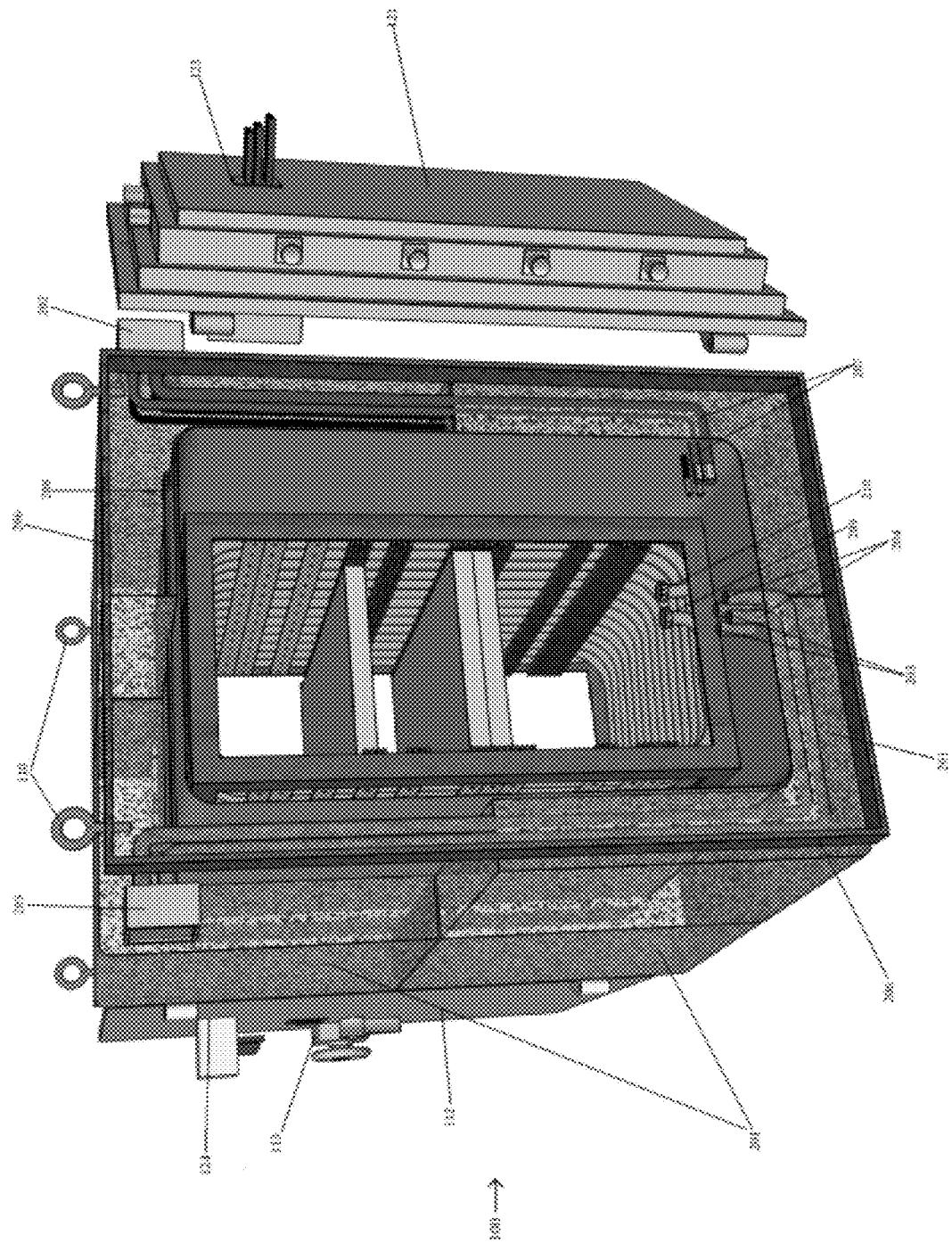
FIG. 2 is a back view representative perspective rendering of the disaster-proof data safe of FIG. 1 with the external sidewall cut away revealing low density concrete, thermal insulation between the external and internal sidewalls of the safe and showing power supply conduit paths and tubular coolant circulation paths between the outside and inside of the safe.

FIG. 2 represents a back-view perspective rendering of the disaster-proof data safe embodiment 100 of FIG. 1 with the all the external sidewalls 101 cut away revealing low density concrete, thermal insulation 201 between the external and internal sidewalls of the safe 100 and showing power supply conduit paths 207 connected to the power inlet port 122, and tubular coolant circulation paths inlets 203 and outlets 204 connected to the coolant circulation wall port 205. Liquid coolant paths between the outside and inside of the safe are achieved through the connections to the inlets/outlets located at coolant circulation wall port 205, and the connections between the Inlets/Outlets 203 and 204 to the helical coil coolant tube Inlets/Outlets 209 and 210, respectively.

To increase the structural rigidity of the data safe in order to survive any impacts as a result of external loads from earth quakes and/or building collapses, external walls and internal walls of the data safe body are reinforced with solid steel beams 206 and 208, respectively. The external and internal wall frame support members have high thermal conductivity, but are thermally isolated through a thick layer of low density concrete insulator 201.

Figure 3:
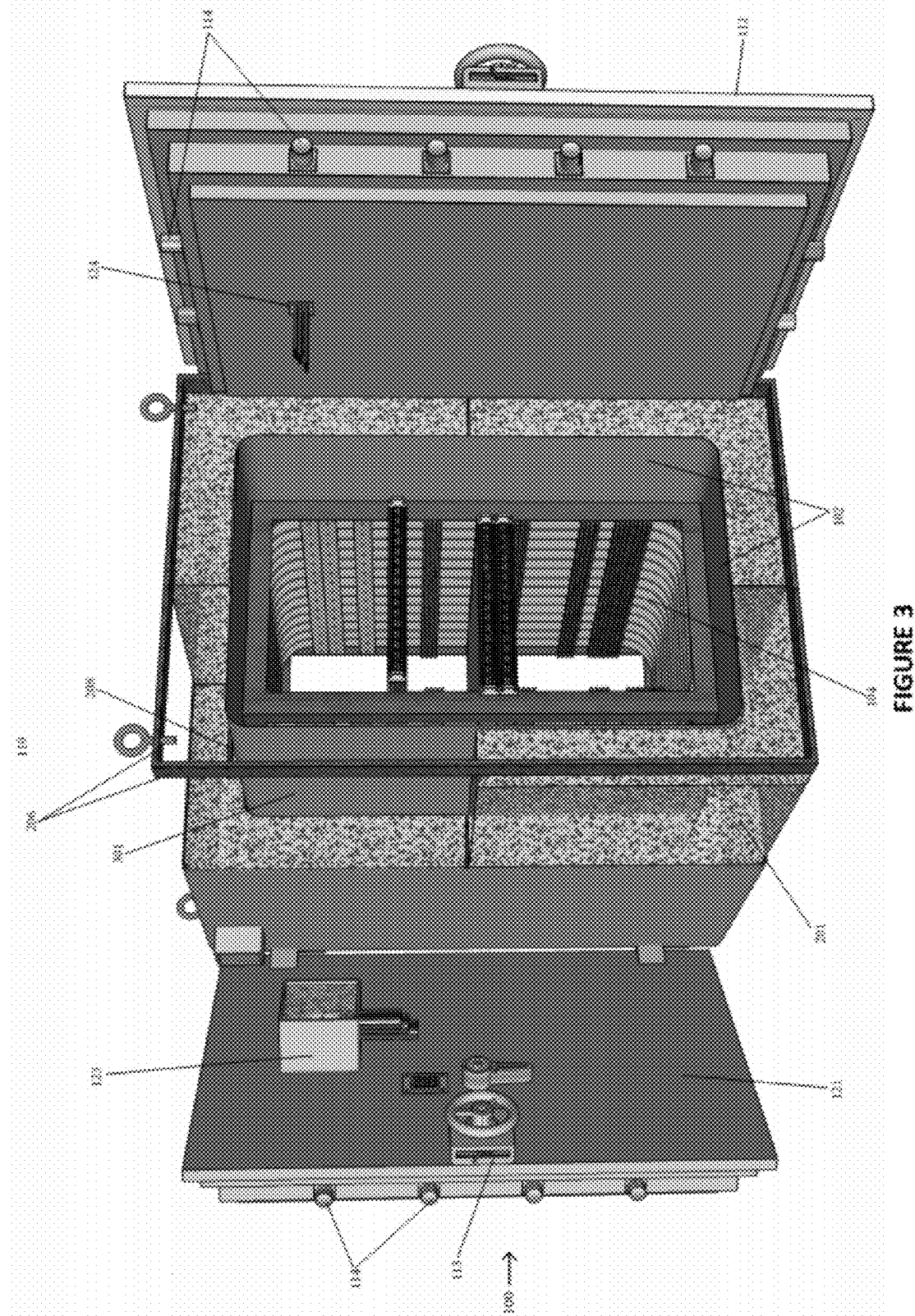
FIG. 3 is a front-view representative perspective rendering of the disaster-proof data safe of FIG. 1 with the outside wall cut away for revealing low density and low thermal conductivity concrete insulation between the interior and exterior walls of the safe

FIG. 3 is a front-view representative perspective rendering of the disaster-proof data safe of embodiment 100 in FIG. 1 with the outside wall 101 cut away for revealing low density and low thermal conductivity concrete insulation 201 between the interior and exterior walls of the safe. A portion of the low density concrete insulator 201 is also removed to reveal the inside surface of the internal safe side wall 301.

Figure 4:
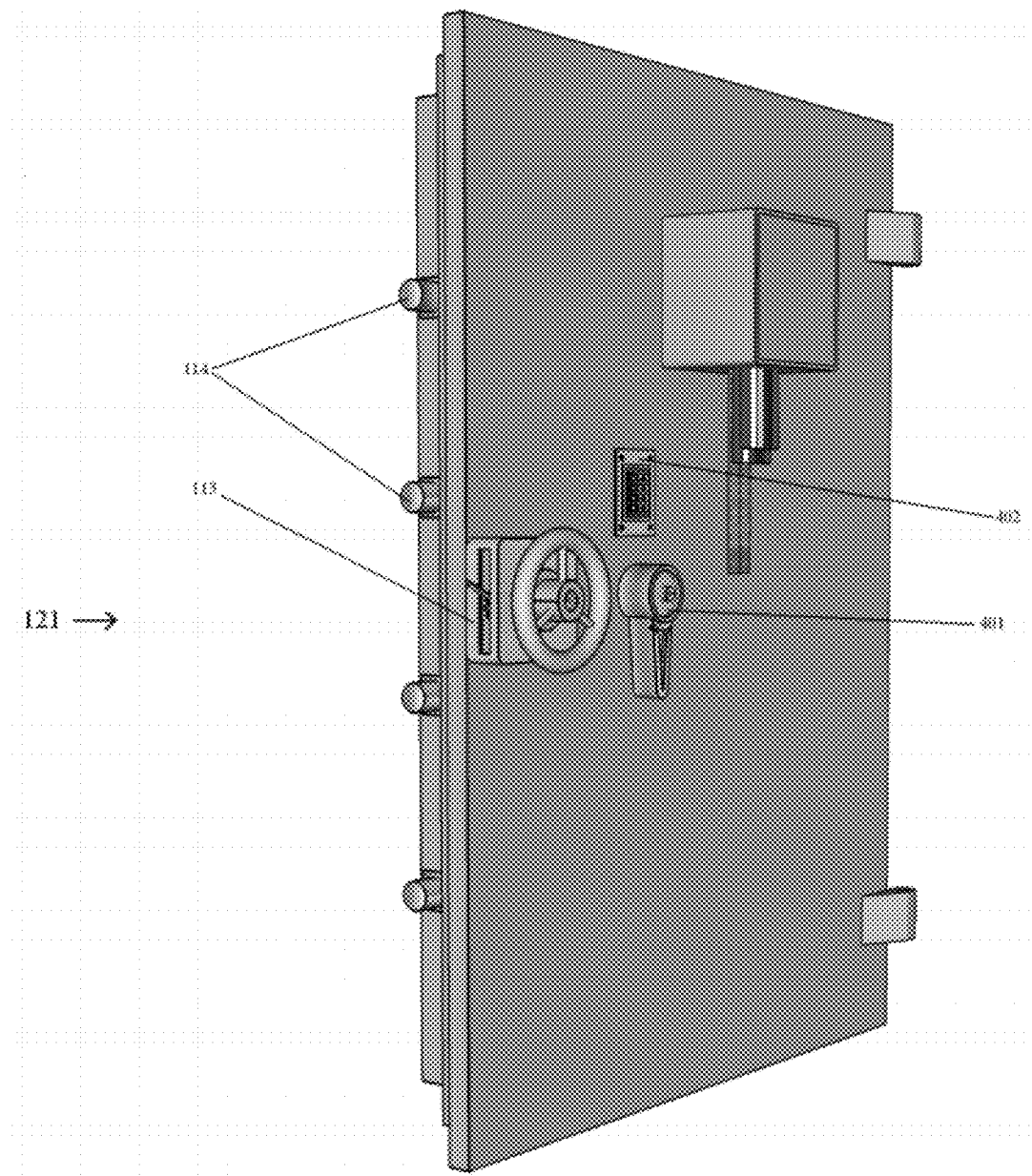
FIG. 4 is a representative perspective rendering of the back door of a disaster-proof data safe with the rear door communications port in place.

FIG. 4 represents a perspective rendering of the back door 121 of a disaster-proof data safe with the rear door communications port 123 in place. Back door 121 has the lock actuator 401 to engage/disengage locking bolts 114 from the locked/unlocked positions. Personnel access to the sensitive equipment inside the data safe is electronically and remotely controlled through digital lock entry keypad 402.

Figure 5:
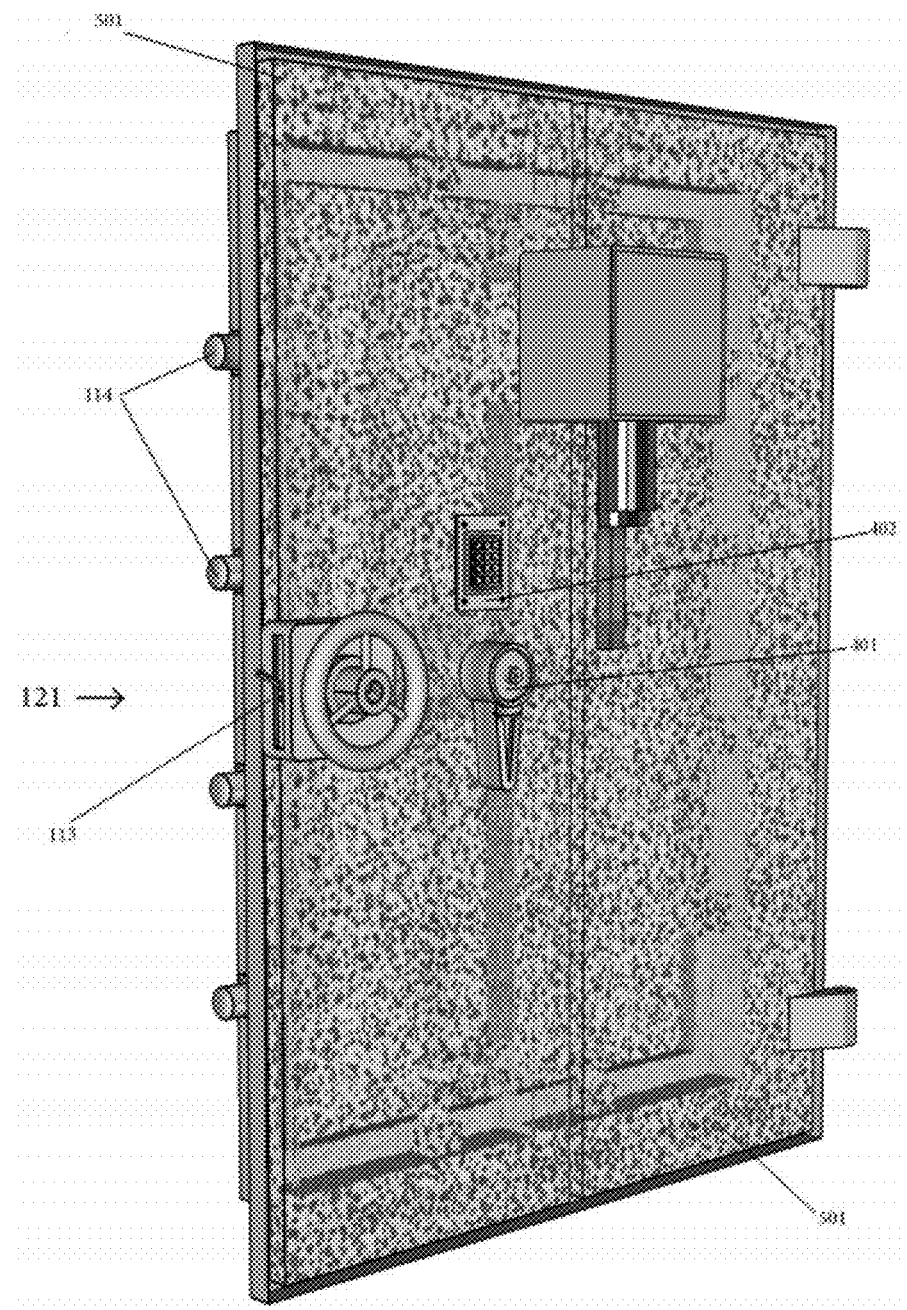
FIG. 5 is a representative perspective rendering of the back door of a disaster-proof data safe with the outermost panel cut away revealing insulation between the interior and exterior walls of the door.

FIG. 5 is a representative perspective rendering of the back door 121 of a disaster-proof data safe 100 with the outermost panel cut away revealing insulation 501 between the interior and exterior walls of the door. Due to limited space, and to accommodate many mechanical locking mechanisms, door insulation could be based on other low thermal conductivity materials such as ceramic fiber or aerogel.

Figure 6:
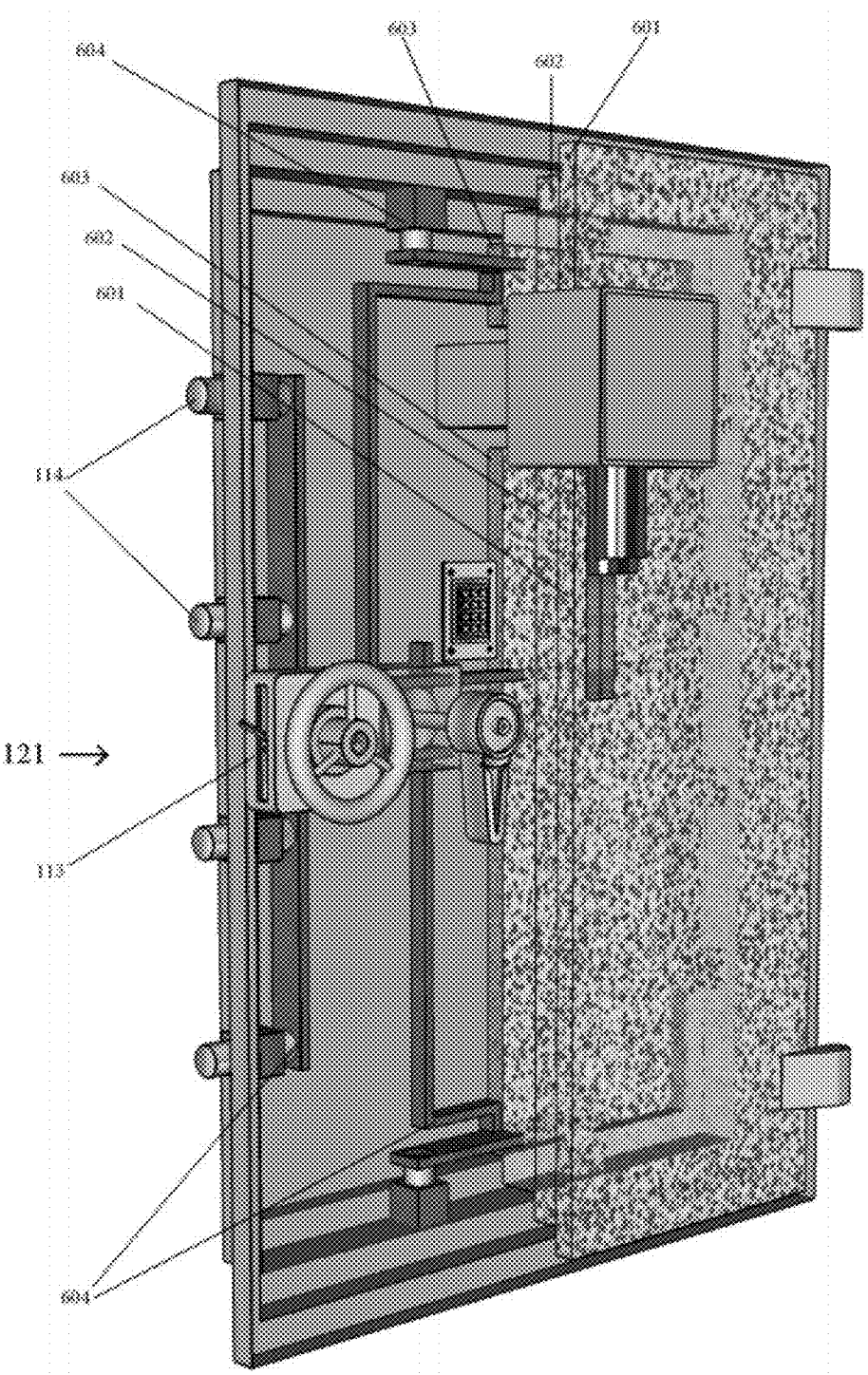
FIG. 6 is a representative perspective rendering of the back door of a disaster-proof data safe with the outer most panel and portions of insulation materials cut-away for revealing multiple layers of insulation between the interior and exterior walls of the door. The locking mechanisms for the safe door locking bolts are also revealed.

FIG. 6 is another representative perspective rendering of the back door 121 of a disaster-proof data safe with the outer most panel and portions of insulation materials cut-away for revealing multiple layers of insulation between the interior and exterior walls of the door. The locking mechanisms 604 for the safe door locking bolts are also revealed. As discussed in FIG. 5, door insulators could employ multilayers insulator materials to accommodate the complexity and mobility of locking mechanisms 604. For illustrative purpose, this embodiment of the rear door 121 has 3 layers composed of outer, middle, and inner insulation layers 601, 602, and 603 respectively.

Figure 7A:
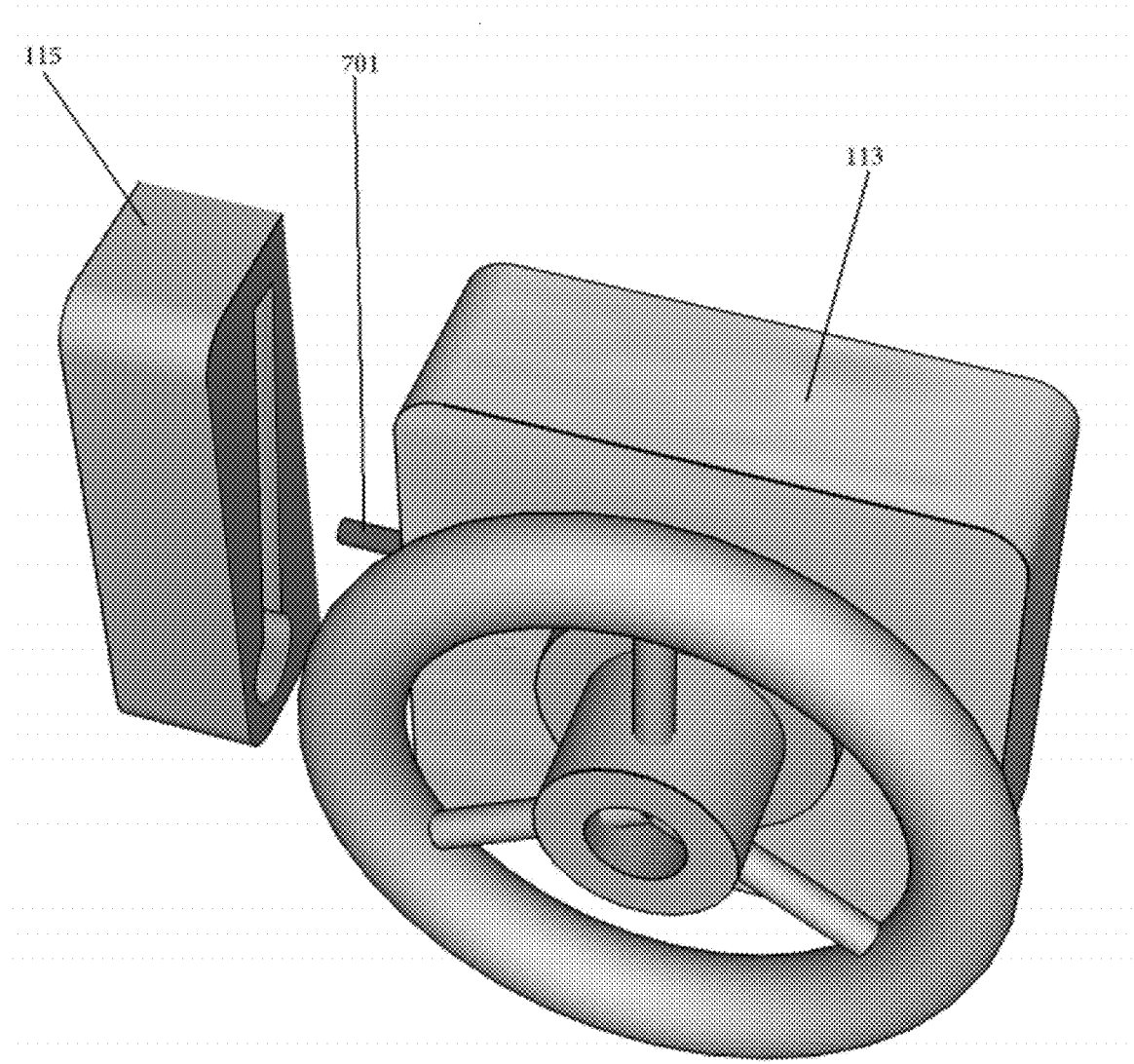
FIGS. 7A, 7B, & 7C are representative perspective renderings showing details of a door cramming latch with the latch engaged and disengaged suitable for compressing bead seals to isolate the internal housing space of a disaster-proof data safe from electromagnetic interference (EMI) and ambient environments outside the safe. The inside drive mechanism of the cramming latch pin is also depicted.
Figure 7B:
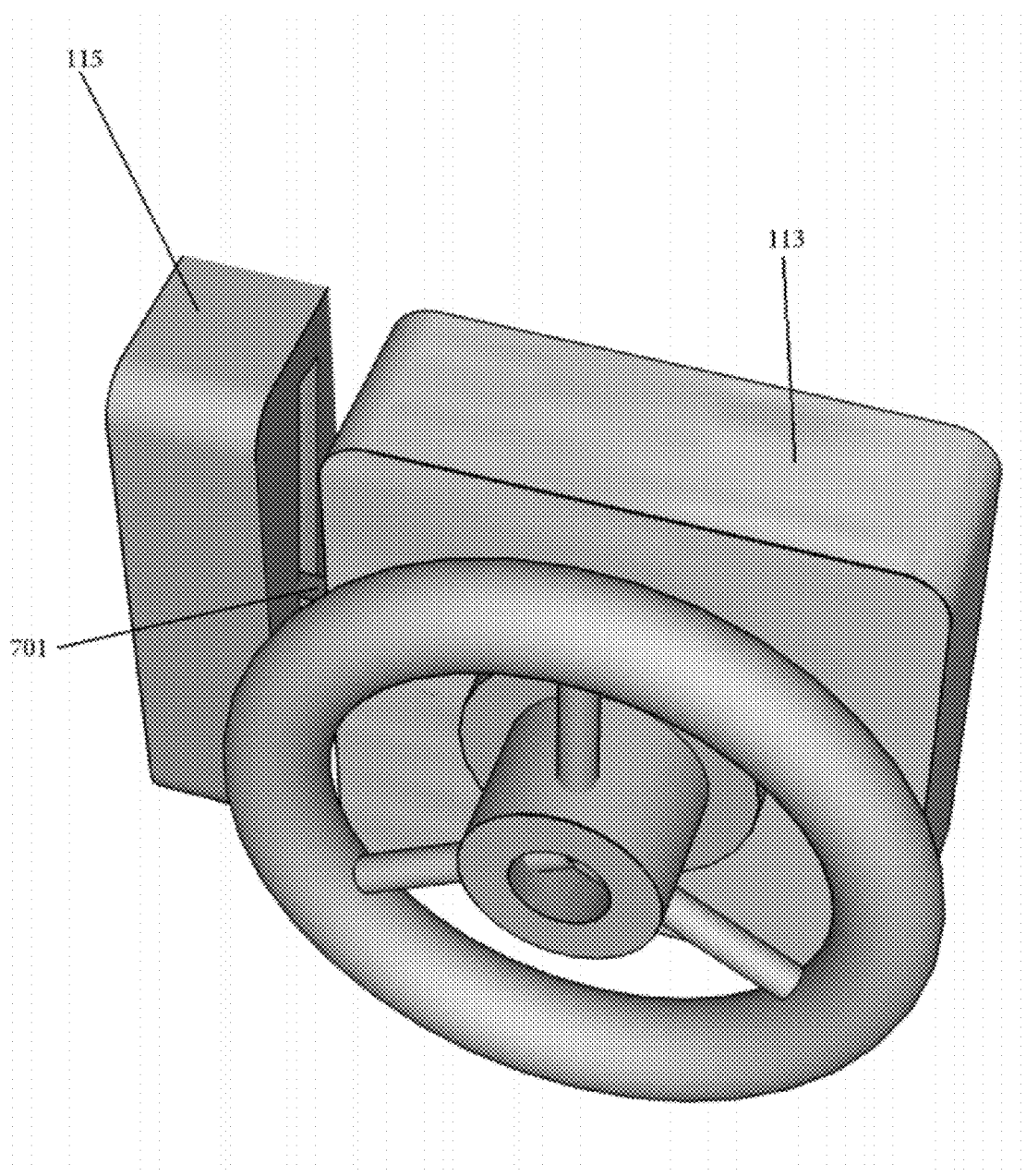
Figure 7C:
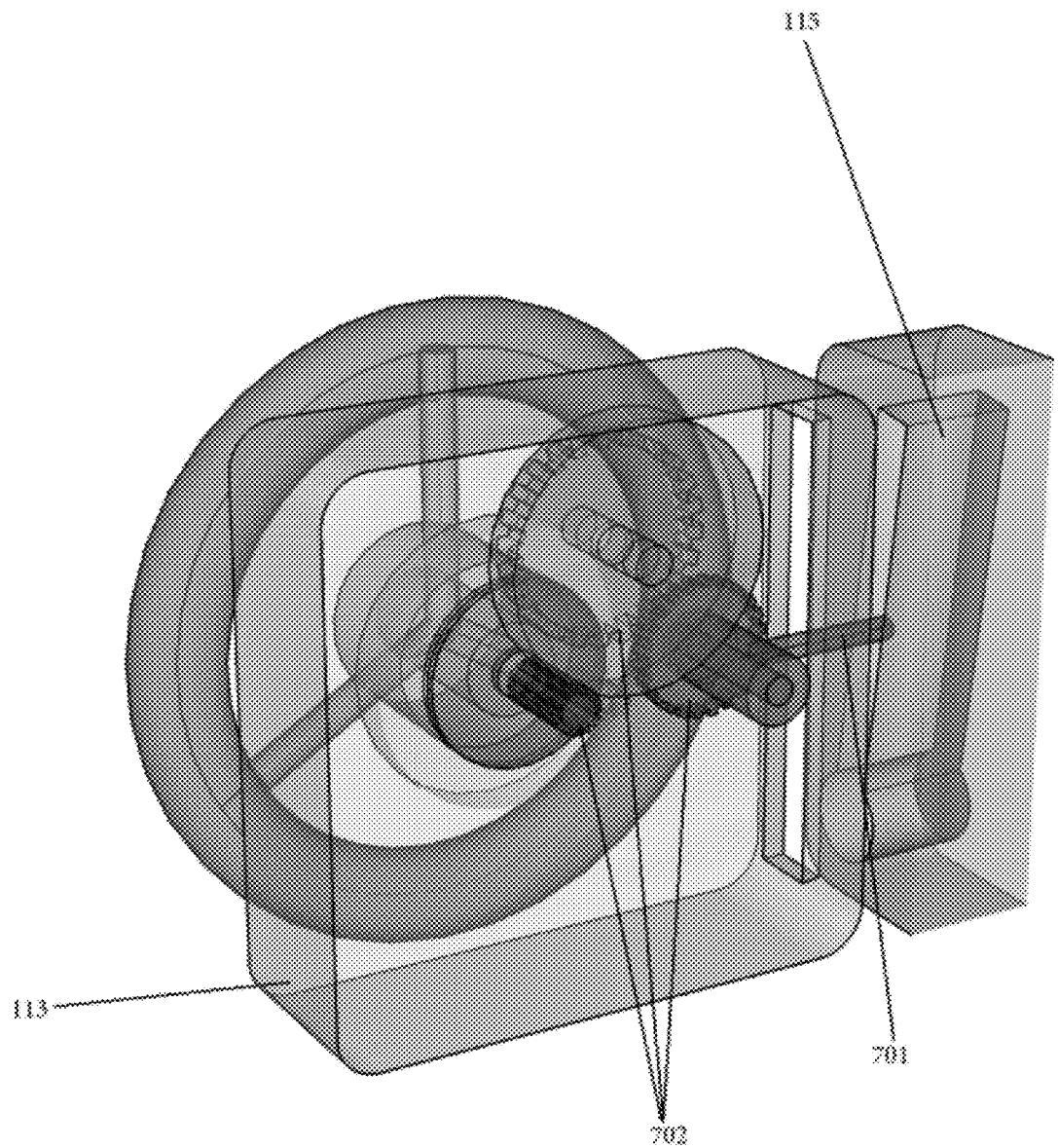

FIGS. 7A, 7B, & 7C show the details of the door cramming latch mechanism with the latch pin 701 engaged and disengaged suitable for compressing bead seals to isolate the internal housing space of a disaster-proof data safe from electromagnetic interference (EMI) and ambient environments outside the safe. The hidden gear drive latch pin mechanism 702 of the cramming latch pin is also depicted. When the door cramming latch 113 turns, the gear mechanism 702 will drive the latch pin 701 up or down depending on the directions of the turn. By moving up or down, the latch pin 701 engaged in the slant slot of door cramming strike 115 will forcefully compress or decompress the safe door, respectively.

Figure 8A:
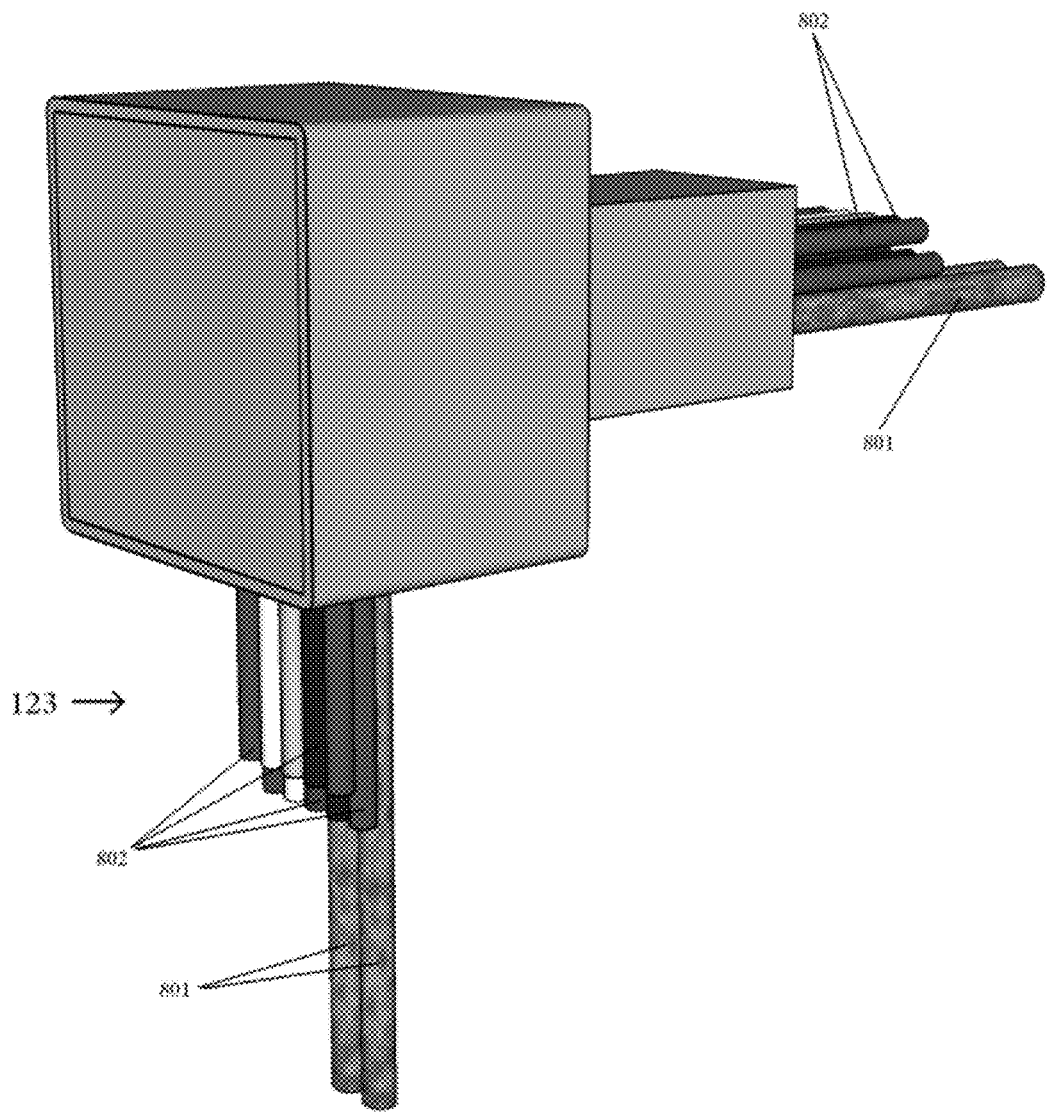
FIGS. 8A, 8B, & 8C are representative perspective renderings of a rear door port for signal cables, power cables, and coolant conduits communicating into and out of the disaster-proof data safe.
Figure 8B:
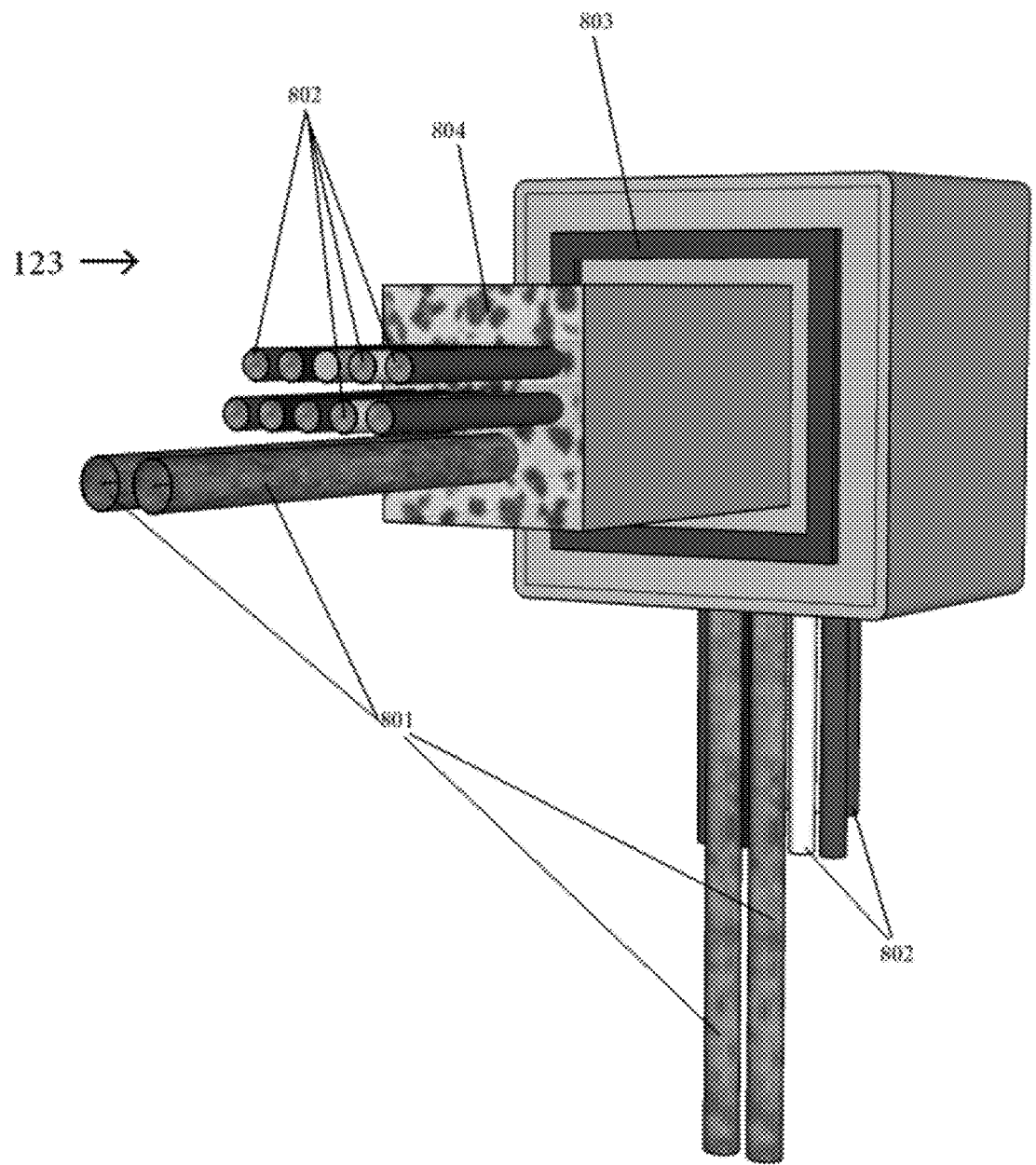
Figure 8C:
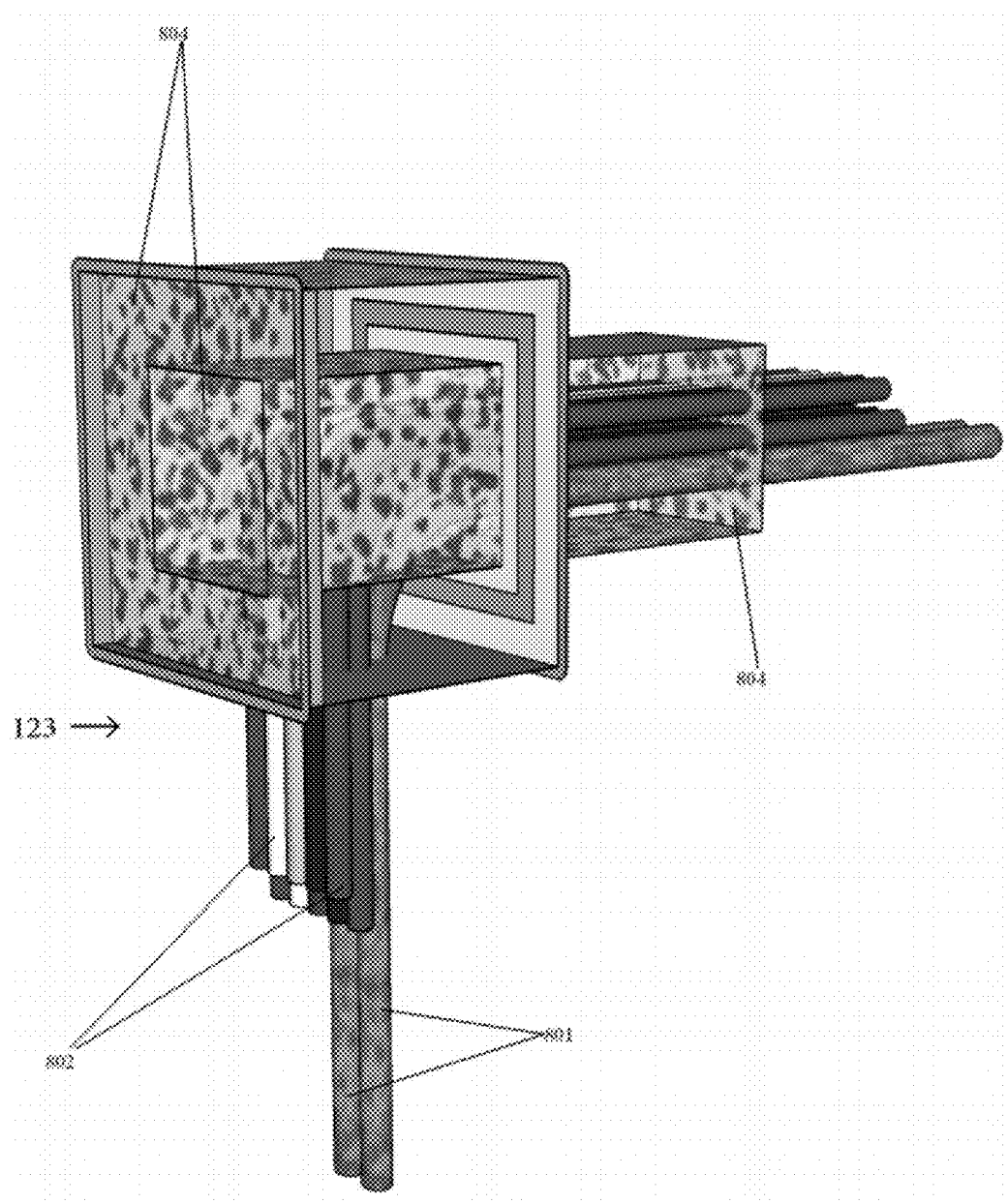

FIGS. 8A, 8B, & 8C are representative perspective renderings of a door conduit module 111 for the communication port 123 that includes signal cables and power cables 802, coolant fluid conduits 801 communicating into and out of the disaster-proof data safe. In FIG. 8C external side and walls of the port 123 are cut away to reveal thermal insulation materials 804. These conduits modules are user configurable and replaceable to accommodate variety of data processing equipment and power density levels. Disposable insulator 804 and rubber seal 803 are fitted to ensure the enclosure is hermetically sealed.

Figure 9A:
FIGS. 9A, & 9B are representative perspective renderings of a helical coil coolant tube in a bare and loaded position.
Figure 9B:
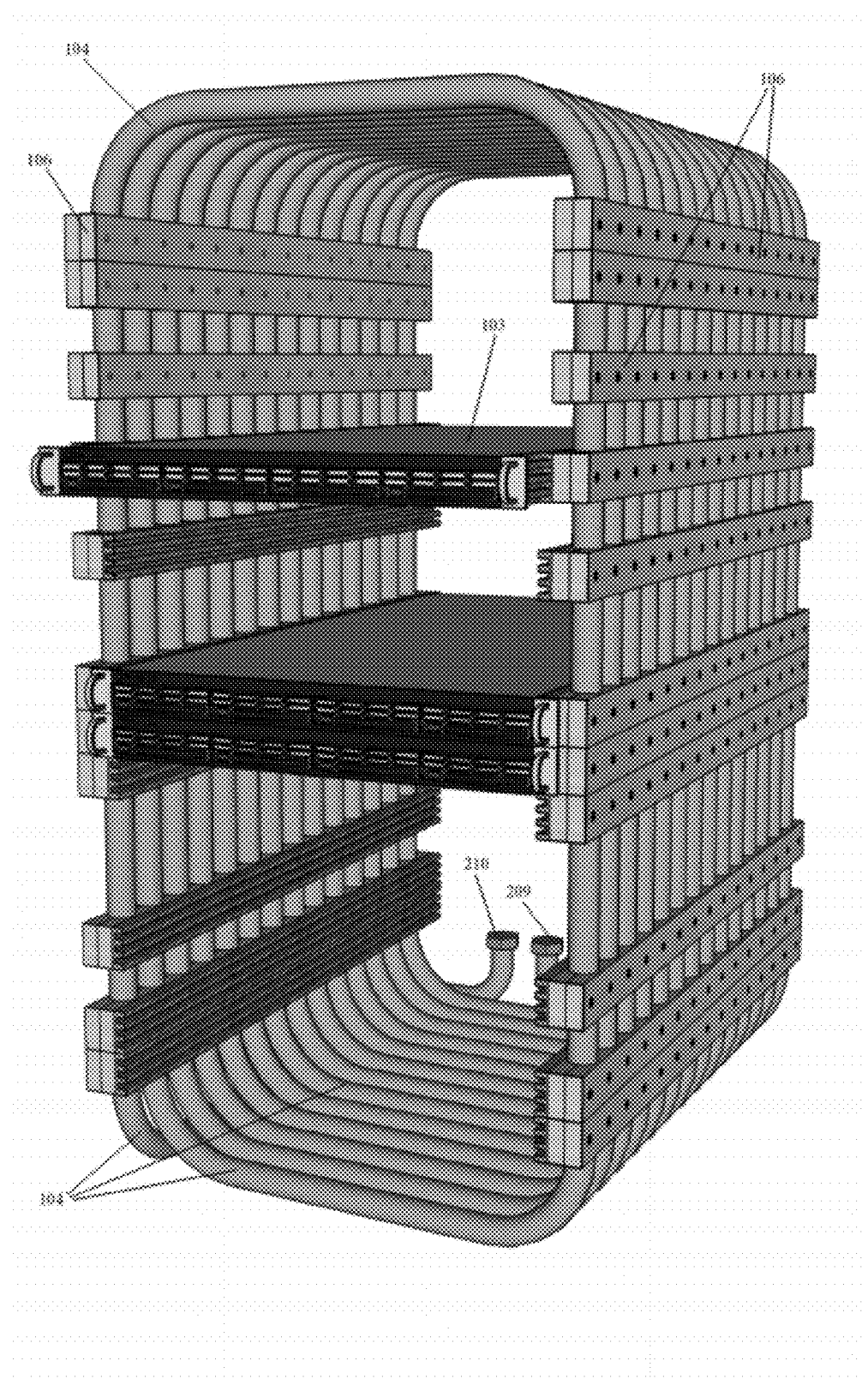

FIGS. 9A & 9B are representative perspective renderings of a helical coil coolant tube 104 in a bare and loaded position. Self-contained embodiments of the disaster-proof safe, have an internal or external pump (not shown) coupled for circulating the coolant liquid through the encircling coaxially helical coil tubes 104. Heat generated by the functioning digital electronic computing, data processing, data storage and communications systems in the interior hexahedral housing space is efficiently transferred (removed) by the coolant liquid circulating through the helical coil tubes 104 and the longitudinal heat sink bars 106.

Figure 9C:
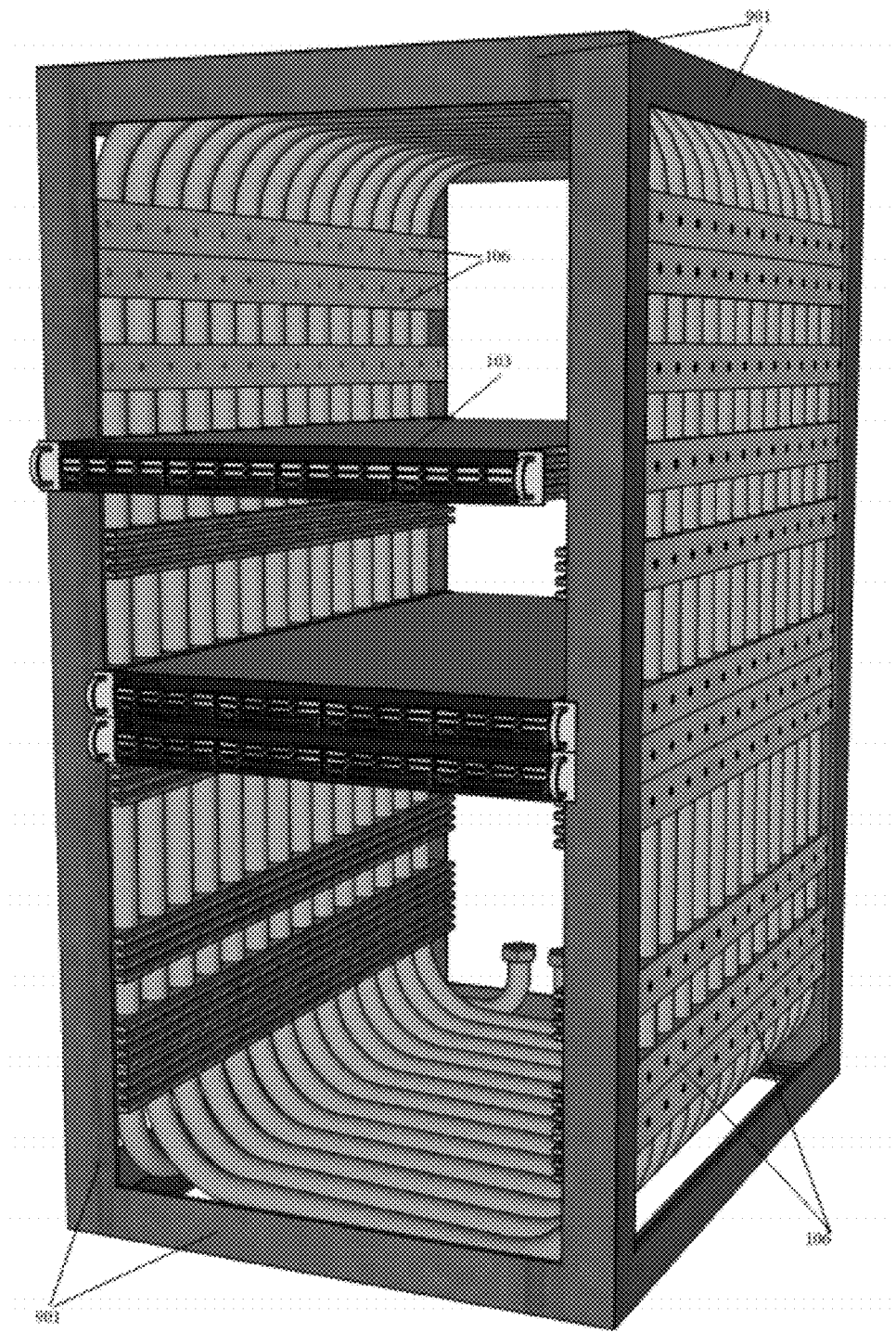
FIG. 9C shows the helical cooling coil coolant tube fitted to a standard equipment rack

FIG. 9C shows the loaded helical coil coolant tubes 104 fitted to a standard equipment rack 901.

Figure 10:
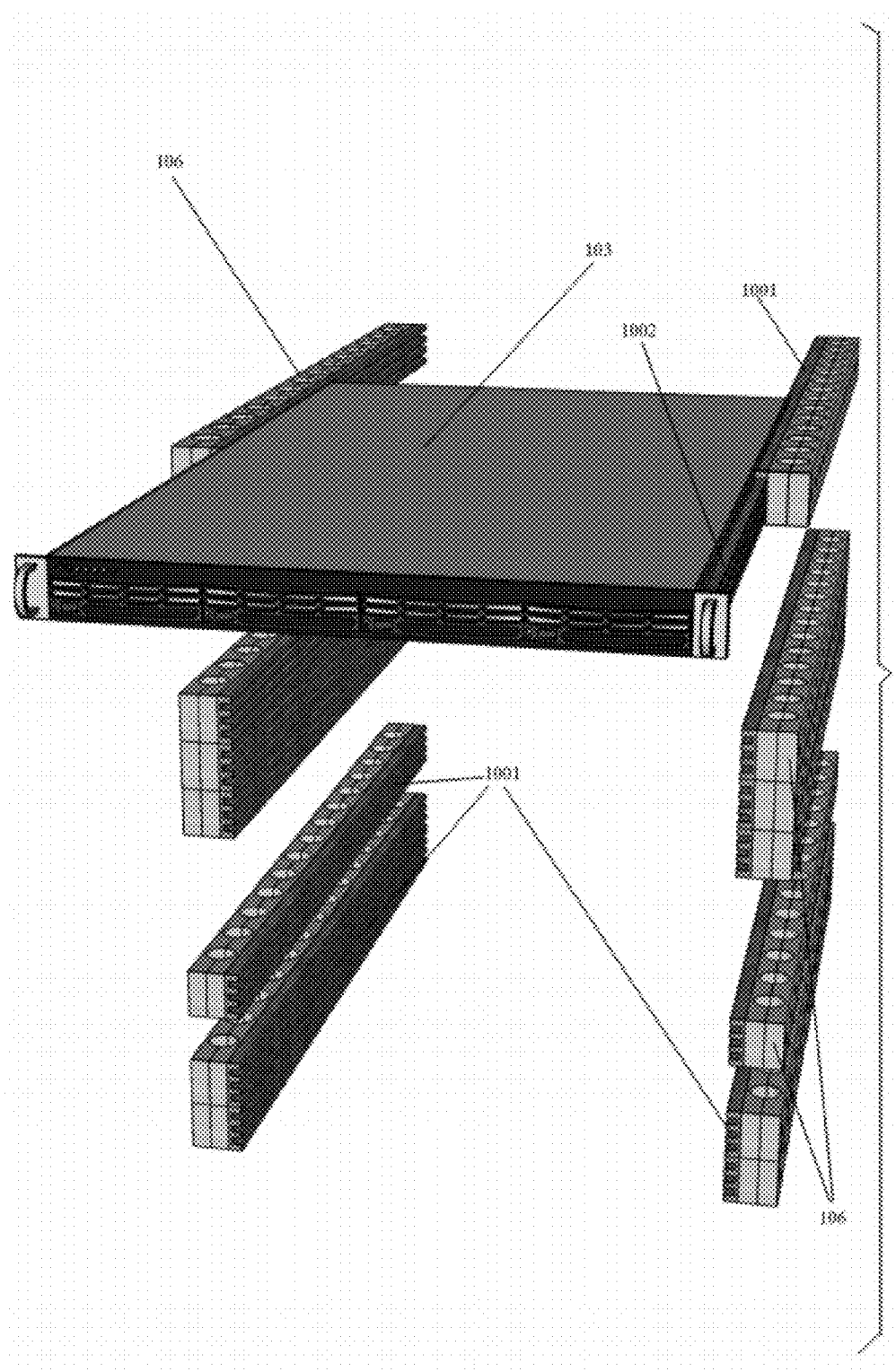
FIG. 10 is a representative perspective disassembled rendering of heat sink bars, and a data processing blade module.

FIG. 10 is a representative perspective disassembled rendering of heat sink bars 106, and a data processing blade module 103. Highly conductive materials such as copper or aluminum are used to construct the heat sink bar 1001 and thermally coupled sliding contact bar 1002 to transfer heat from the data processing blade component 103 to the heat sink bar 106. The heat is subsequently removed by the circulating liquid coolant in the helical coil coolant tubes 104.

Figure 11:
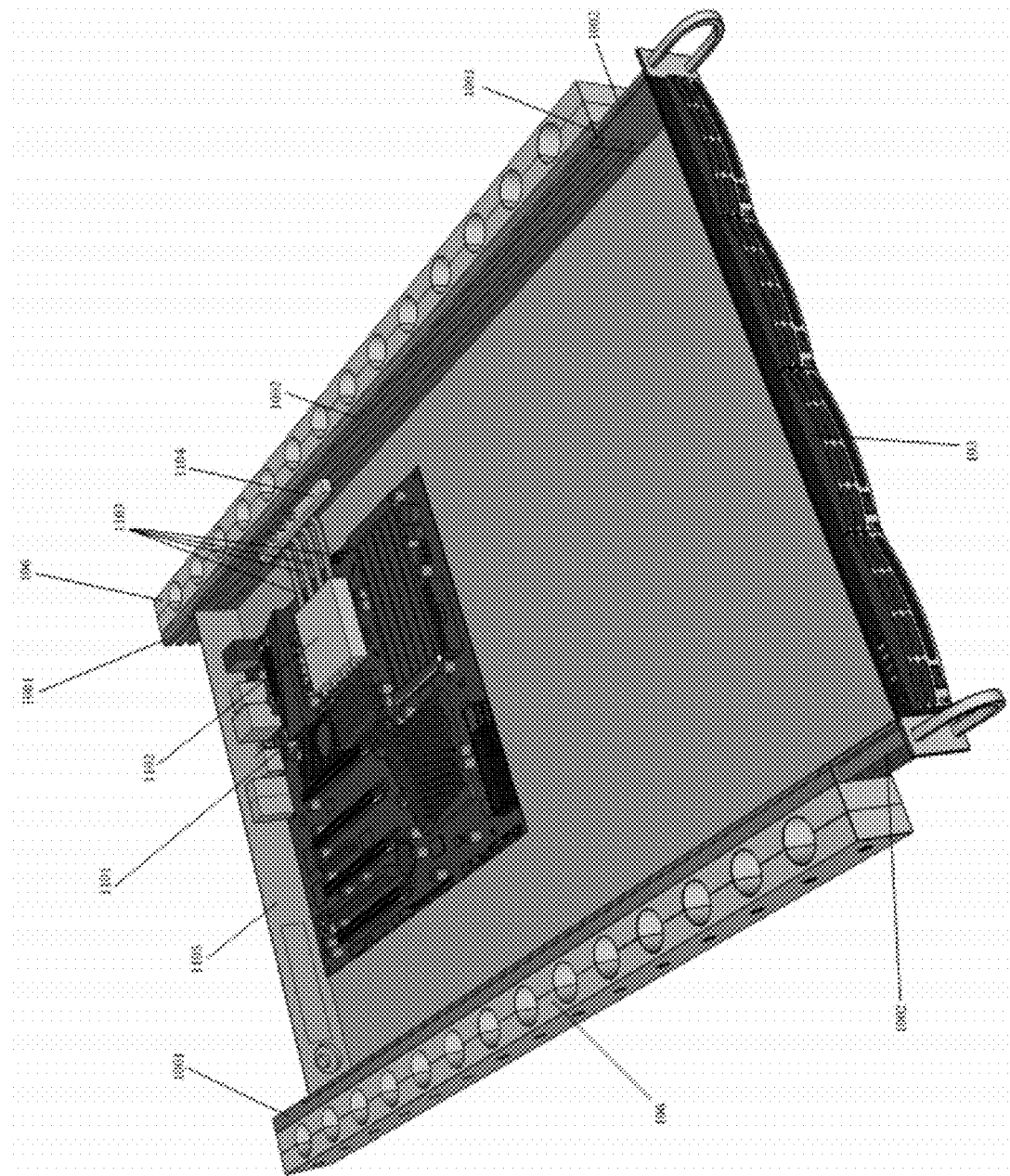
FIG. 11 is a representative perspective rendering of a blade server module with a heat generating component (CPU or GPU) thermally coupled by an array of heat pipes to the heat sink bars adapted for mechanically supporting and thermally coupling with the blade server module mounted within the disaster-proof data safe.

FIG. 11 is a further detail representative perspective rendering of a blade server module 103 with a heat generating component 1101 (CPU or GPU) thermally coupled through a component heat sink 1102 by an array of heat pipes 1103 through the sliding contact 1104 and then to the heat sink bars 1001 and 1002. The enclosure wall 1105 of the electronic component 103 is also shown for illustration.

Figure 12:
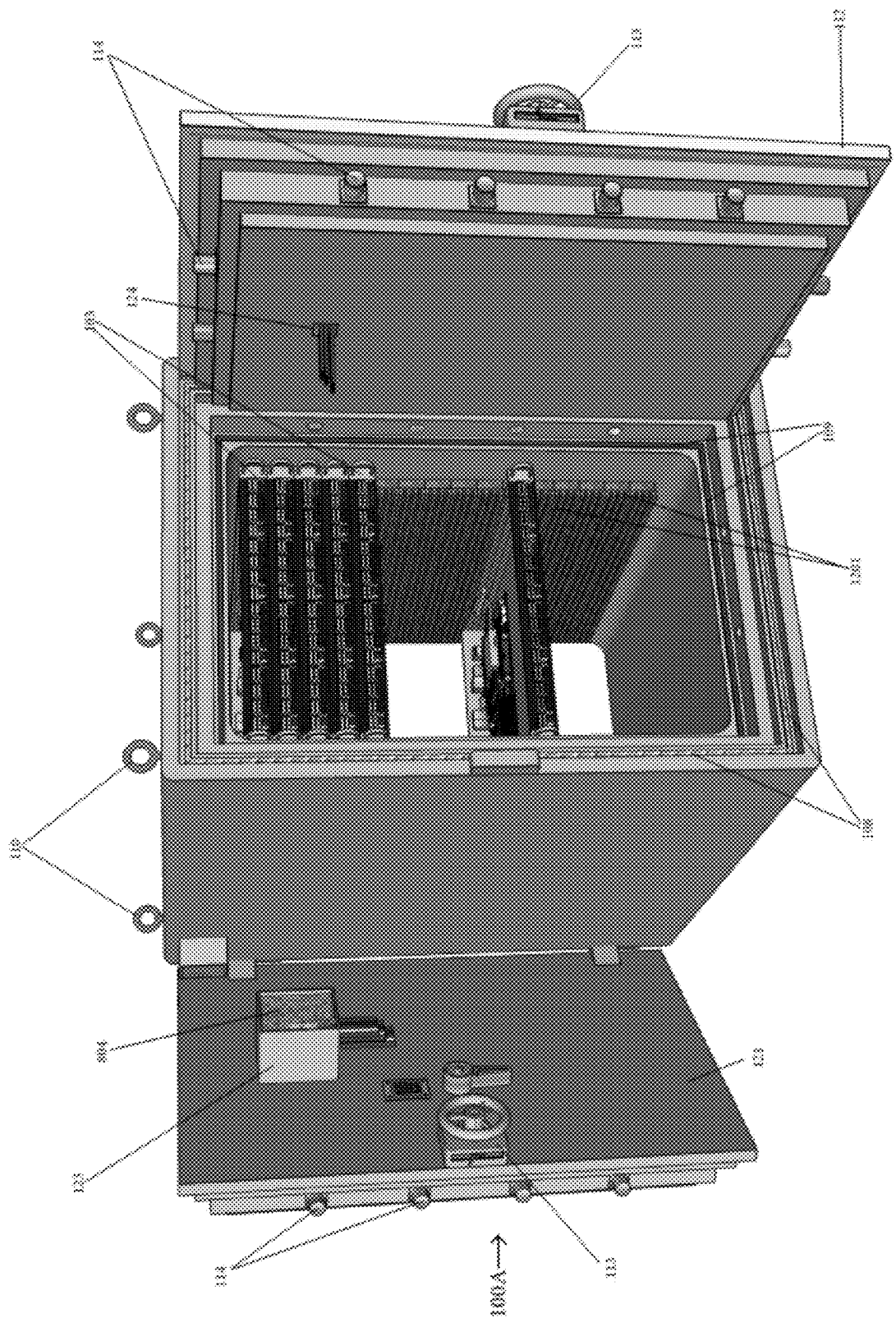

FIG. 12 is perspective rendering of another embodiment of a disaster-proof data safe 100A with front door 112 and rear door 121 open showing a vertical array of heat sink bars 1201 mechanically secured to, and thermally with opposite sidewalls 102 of the internal housing space of the safe adapted to receive, support and thermally couple with blade server modules and the like. The helical coil coolant tubes 104 are no longer needed as will be explained in the discussions of FIG. 13 below.

Figure 13:
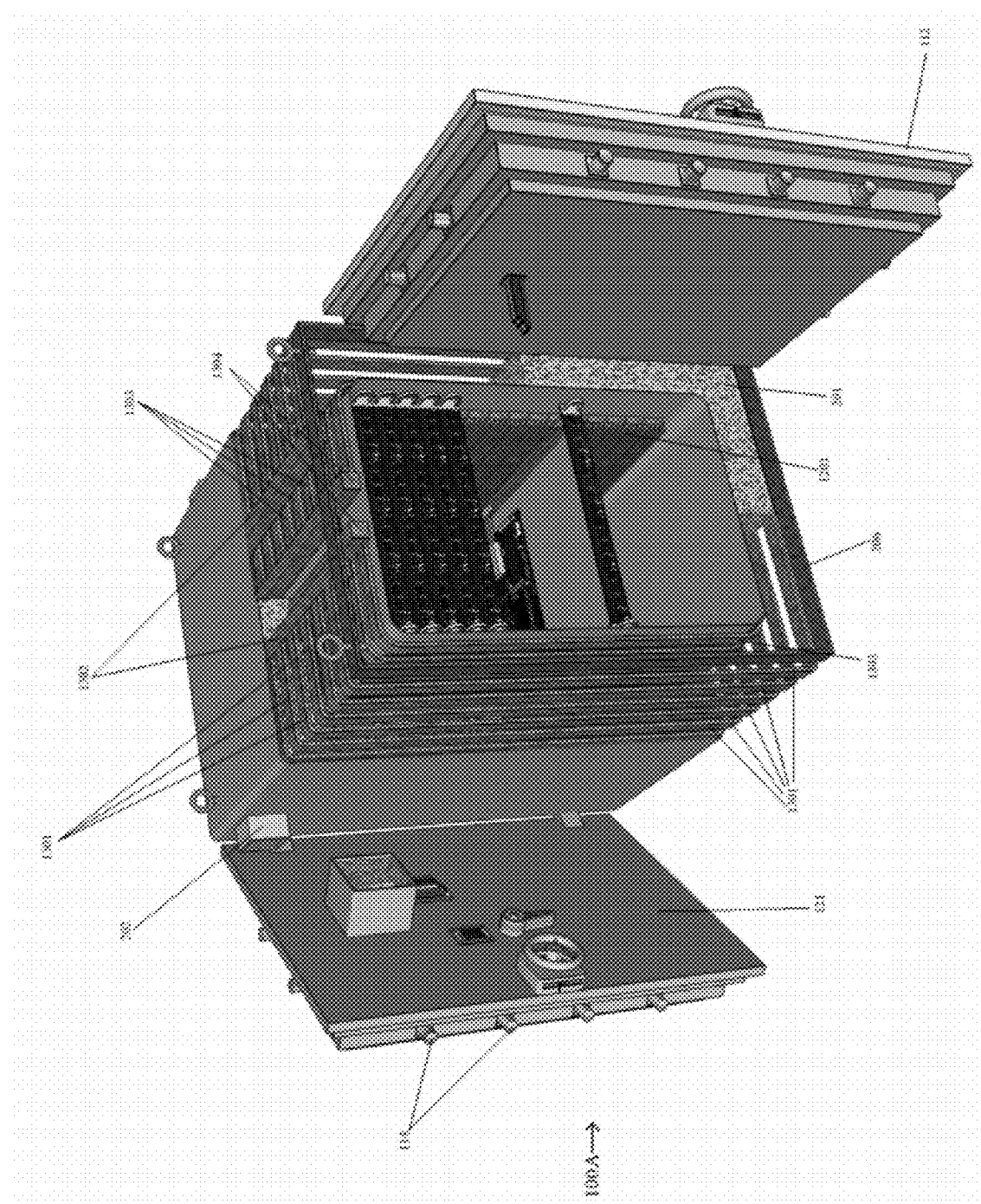
FIG. 13 is a front-view representative perspective rendering of the disaster-proof data safe of FIG. 12 with portion of the outside wall cut away revealing insulation between the interior and exterior walls of the safe, and showing two separate coaxial arrays of rectangular coolant tubes mechanically and thermally coupling to the outside surfaces of the internal safe sidewalls and the inside surfaces of the external safe sidewalls respectively.

FIG. 13 is a front-view representative perspective rendering of the disaster-proof data safe 100A of FIG. 12 with portion of the outside wall cut away revealing insulation between the interior and exterior walls of the safe, and showing two separate coaxial arrays of rectangular coolant tubes (inside array of rectangular coolant tubes 1303 and outside array of rectangular coolant tubes 1301) mechanically and thermally coupling to the outside surfaces of the internal safe sidewalls and the inside surfaces of the external safe sidewalls respectively. Inlets/Outlet for fluid coolant is connected through the manifold 1302 and 1304 for the outside array of rectangular coolant tubes 1301 and the inside array of rectangular coolant tubes 1303, respectively.

Figure 14:
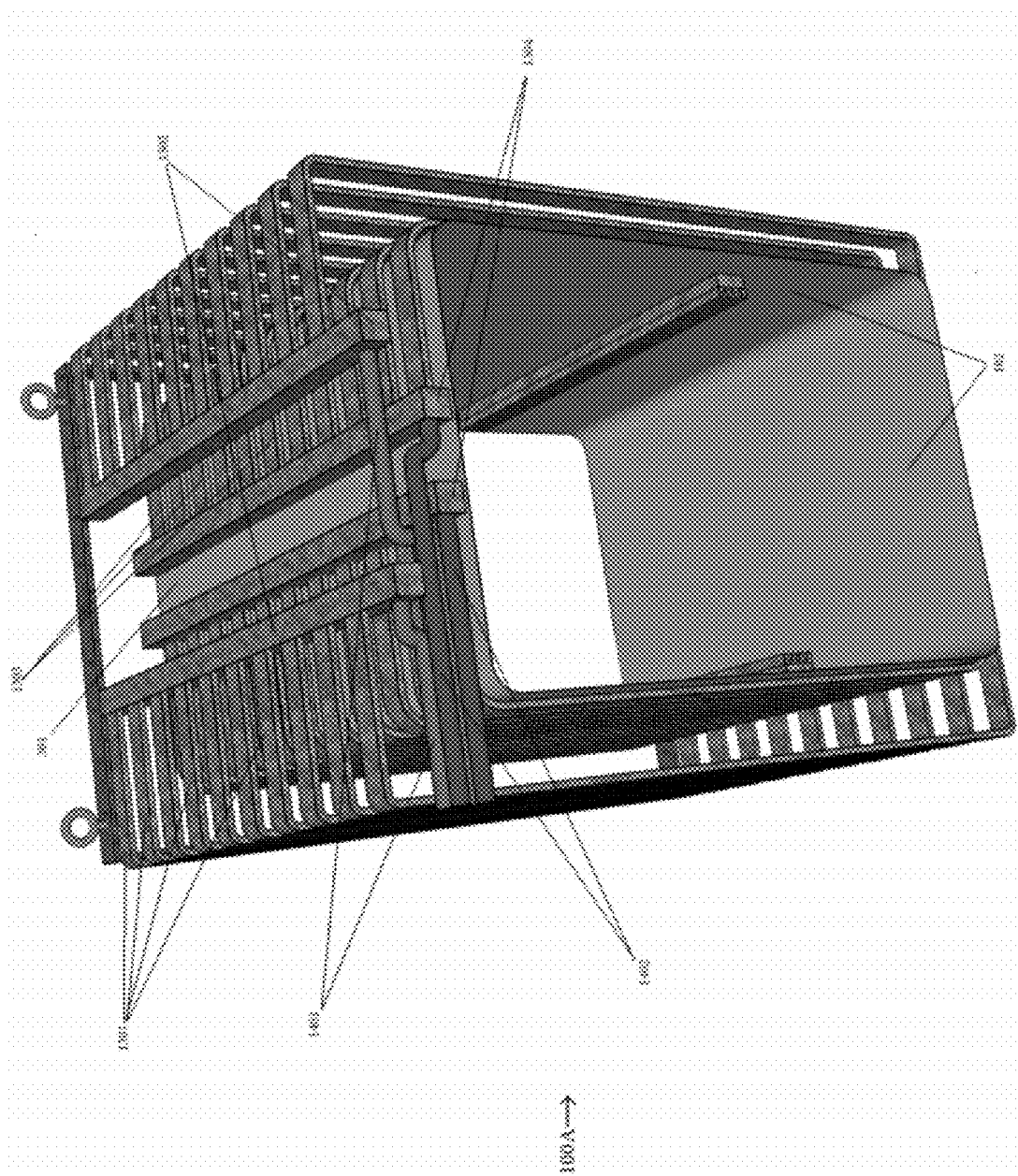
FIG. 14 is a representative perspective rendering showing details of the two separate coaxial rectangular arrays coolant tubes shown in FIG. 13.

FIG. 14 shows further details of the two separate coaxial rectangular arrays coolant tubes shown in FIG. 13. In particular, it shows how the Inlet/Outlet 1401 to manifolds for outside array of rectangular coolant tubes 1302 and the Inlet/Outlet 1402 to manifolds for inside array of rectangular coolant tubes 1304 are connected, respectively.

Figure 15:
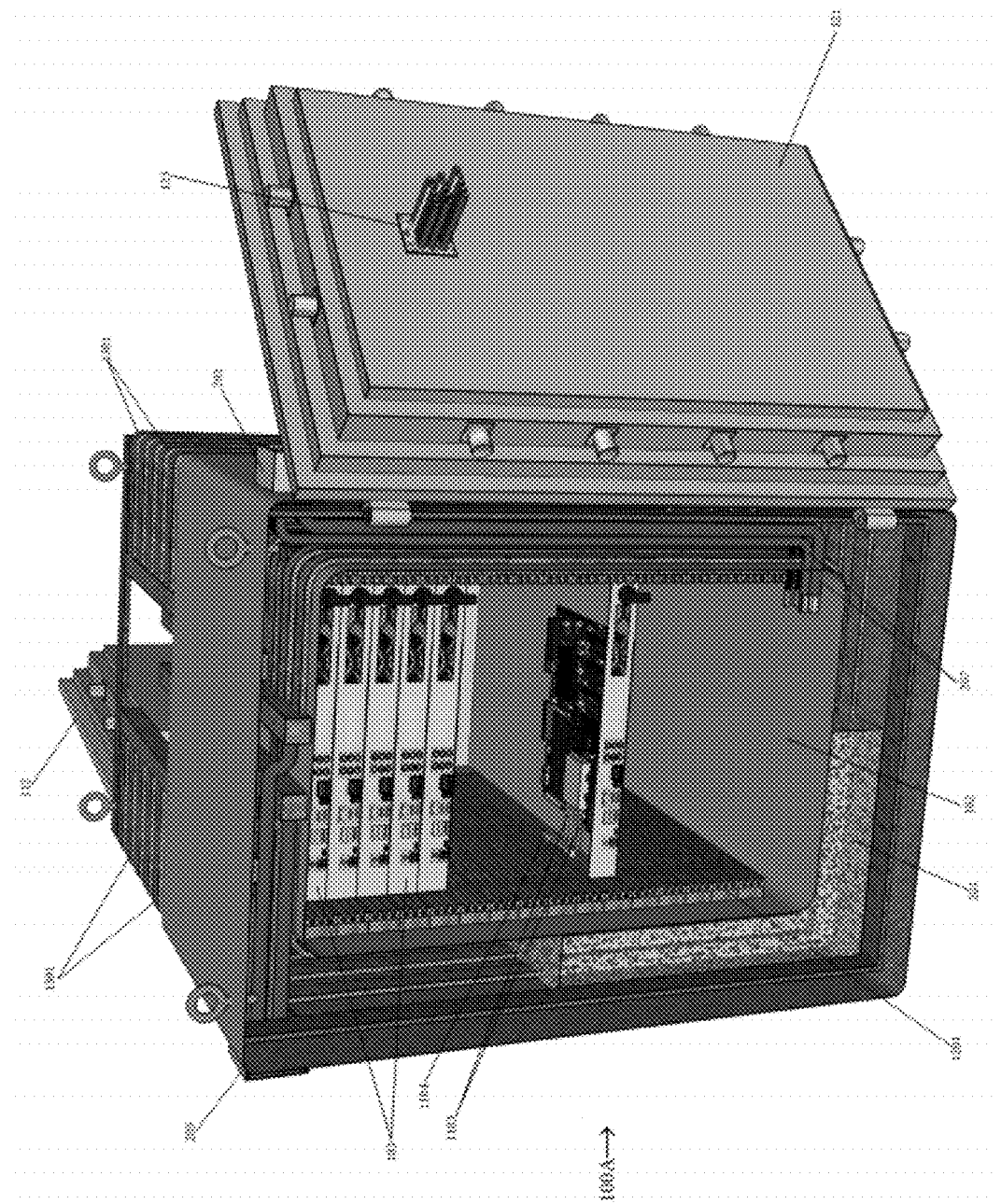
FIG. 15 is a back-view representative perspective rendering of the disaster-proof data safe of FIG. 12.

FIG. 15 is a back-view representative perspective rendering of the disaster-proof data safe 100A of FIG. 12.

FIG. 16 is another embodiment of a disaster-proof data safe with only a single safe door.

The foregoing description of the invention has been presented for purposes of illustration and description and is not intended to be exhaustive or to limit the invention to the precise form disclosed. Modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

We claim:

1. A disaster-proof data safe having an exterior and an insulated interior, surrounding, solid structural metal sidewalls and end-doors for housing functioning digital electronic computing, data processing, data storage and communications systems, comprising in combination therewith:

a) at least one internal, coaxial, helical coil coolant tube containing a coolant liquid encircling sides of an interior, hexahedral housing space within the safe;

b) plurality of longitudinal heat sink bars thermally coupled to each helical coil tube;

c) means coupled for circulating the coolant liquid through each coaxial, helical coil coolant tube for transporting heat generated by the housed, functioning digital electronic computing, data processing, data storage and communications systems to and from the longitudinal heat sink bars and surrounding solid structural metal sidewalls of the safe;

d) at least one multiple-jam, portal frame providing access into the interior, hexahedral housing volume of the safe;

e) at least one multiple-wall insulated, solid structural metal, lockable, safe end-door having multiple-strike surfaces configured to nest snugly into for closing and locking with the multiple-jam portal frame;

f) a first bead type seal secured and located around an inner jam surface of the multiple jam portal frame for compression by a mating strike surface of the safe end-door closed and locked within the portal frame for hermitically isolating the interior hexahedral housing space;

g) a second bead type seal secured and located around an outer jam surface of the multiple jam portal frame for compression by a mating strike surface of the safe end-door closed and locked within the portal for isolating the interior hexahedral housing space form electromagnetic interference (EMI);

h) means for hermetically supplying electrical power to, providing communications with and allowing control of systems housed in the interior hexahedral housing space of the safe from outside the safe.

2. The disaster-proof data safe of claim 1 further including means thermally coupling between a heat generating component of a housed system and an adjacent longitudinal heat sink bar thermally cooled by an encircling helical coil coolant tube.

3. The disaster-proof data safe of claim 1 or 2 wherein each helical coil coolant tube and the heat sink bars are preferably composed from metals such as copper, aluminum and their alloys that have a high thermal conductivity and that retain structural integrity at temperature ranging up to 500° C.

4. The disaster-proof data safe of claim 1 or 2 wherein the coolant liquid is an engineering liquid formulation from a class consisting of water, thermal oil, silicon oil, liquid nitrogen, liquid helium, propylene and ethylene glycols, di- and tri-aryl compounds, per-fluorocarbons (PFCs), per-fluoropolyethers (PFPEs) and C14-C30 alkyl benzenes.

5. The disaster-proof data safe of claim 1 or 2 wherein means for hermetically supplying electrical power to, providing communications with and controlling the systems housed in interior hexahedral housing space of the safe comprise hermetic electrical and electromagnetic signal conduits communicating through walls of the safe and door into and out of the interior hexahedral housing space of the safe.

6. The disaster-proof data safe of claim 5 wherein electrical and electromagnetic conduits have disposable insulator collars and follow a 'J' path through insulation layers in between the walls of the safe and door.

7. The disaster-proof data safe of claim 1 or 2 wherein the means coupled to each coaxial, helical coolant coil coolant tube for circulating the coolant liquid around the coaxial helical coil coolant tube is located within the interior, hexahedral housing space of the safe.

8. The disaster-proof data safe of claim 1 or 2 wherein the means for circulating the coolant liquid around the coaxial helical coil tube is located outside the safe and coupled to opposite ends of the helical coil tube via inlet/outlet coolant ports hermetically communicating through the sidewalls of the safe.

9. The disaster-proof data safe of claim 8 and further including a conventional vapor-compression cycle refrigeration system having:

i) a compressor and a condenser located outside the safe, j) an expansion valve and evaporator located in the interior, hexahedral housing space of the safe thermally coupled for cooling an internal, coaxial, helical coil coolant tube containing the circulating liquid coolant, k) internal refrigerant tubing having disposable insulator collars with terminating exterior inlet and outlet refrigerant ports hermetically communicating, along a 'J' path through insulation between the sidewalls of the safe for circulating a two phase refrigerant fluid through the expansion valve and the evaporator, l) exterior refrigerant tubing connectable to the inlet and outlet refrigerant ports for circulating the two phase refrigerant fluid through the compressor and condenser; and m) means outside the safe for controlling the refrigeration system for adjusting temperature in the interior, hexahedral housing space.

10. The disaster-proof data safe of claim 8 and further including means outside the safe for controlling temperature of the circulating coolant liquid.

11. A disaster-proof data safe having an external and an internal, surrounding, solid structural metal sidewalls and end-doors for housing functioning digital electronic computing, data processing, data storage and communications blade server systems, comprising in combination therewith:

a. The external sidewalls of the safe and the internal sidewalls of a hexahedral housing space located within the safe composed of thermally and electrically conductive structural metal alloys that retain structural integrity at temperatures ranging up to 1500° C.;

b. a solid structural, thermally insulating material disposed between the exterior and interior side walls of the safe;

c. a first internal, coaxial, array of rectangular coolant tubes mechanically and thermally bonded to outside surfaces of the internal sidewalls of the, hexahedral housing space;

d. a first means for circulating a first coolant through the first internal, coaxial, array of rectangular coolant tubes;

e. a second internal, coaxial, array of rectangular coolant tubes mechanically and thermally bonded to inside surfaces of the external sidewalls of the safe;

f. a second means for circulating a second coolant through the second internal, coaxial, array of rectangular coolant tubes;

g. a plurality longitudinal heat sink bars mechanically secured to and thermally bonded to the inside surfaces of the internal sidewalls of the interior, hexahedral housing space.

12. The disaster-proof data safe of claim 11 wherein parallel pairs of longitudinal heat sink bars are mechanically secured and thermally bonded to opposing inside surfaces of the internal sidewalls of the hexahedral housing space within the safe and are adapted for mechanically supporting and thermally coupling with high power density blade server modules of a blade computing system.

13. The disaster-proof data safe of claim 12 further including means thermally coupling between a heat generating component of a blade module and an adjacent longitudinal heat sink bar.

* * * * *